US009695511B2

(12) United States Patent
Murata et al.

(10) Patent No.: US 9,695,511 B2
(45) Date of Patent: Jul. 4, 2017

(54) SUBSTRATE PROCESSING APPARATUS, METHOD OF MANUFACTURING SEMICONDUCTOR DEVICE AND METHOD OF PROCESSING SUBSTRATE

(71) Applicant: Hitachi Kokusai Electric Inc., Tokyo (JP)

(72) Inventors: Hitoshi Murata, Toyama (JP); Tetsuya Kosugi, Toyama (JP); Masaaki Ueno, Toyama (JP); Masashi Sugishita, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 145 days.

(21) Appl. No.: 14/490,239

(22) Filed: Sep. 18, 2014

(65) Prior Publication Data

US 2015/0093909 A1 Apr. 2, 2015

Related U.S. Application Data

(63) Continuation of application No. PCT/JP2013/058322, filed on Mar. 22, 2013.

(30) Foreign Application Priority Data

Mar. 22, 2012 (JP) .................................. 2012-065698

(51) Int. Cl.
C23C 16/52 (2006.01)
C23C 16/455 (2006.01)
(Continued)

(52) U.S. Cl.
CPC .......... *C23C 16/52* (2013.01); *C23C 16/4411* (2013.01); *C23C 16/45593* (2013.01);
(Continued)

(58) Field of Classification Search
CPC ... C23C 16/52; C23C 16/45593; C23C 16/46; C23C 16/4411; H01L 21/02271; H01L 21/28506; H01L 21/0262
(Continued)

(56) References Cited

U.S. PATENT DOCUMENTS 5,616,264 A 4/1997 Nishi et al.
8,030,599 B2 * 10/2011 Shimada ........... H01L 21/67109
118/724
(Continued)

FOREIGN PATENT DOCUMENTS

JP 05-067577 A 3/1993
JP H05-067577 A 3/1993
(Continued)

OTHER PUBLICATIONS

Korean Notice of Reasons for Rejection, KR Application No. 10-2014-7026017, Sep. 10, 2015, 14 pgs. (English translation provided).

*Primary Examiner* — Jeffrie R Lund
(74) *Attorney, Agent, or Firm* — Volpe and Koenig, P.C.

(57) ABSTRACT

A substrate processing apparatus including a vertical reaction container; an insulating wall formed of an insulating material and including a reaction container accommodation chamber for accommodating the reaction container therein; a heater installed in an inner wall of the reception container reception chamber on the insulating wall; an air circulation channel installed vertically in a sidewall of the insulating wall; a blower for distributing air upward or downward in the air circulation channel; intake valves for communicating the air circulation channel with the air; and exhaust valves for communicating the air circulation channel with an equip-
(Continued)

ment exhaust system. In a temperature elevating process and a temperature lowering process, the intake valves and the exhaust valves are switched.

6 Claims, 19 Drawing Sheets

(51) Int. Cl.
    *C23C 16/46*       (2006.01)
    *C23C 16/44*       (2006.01)
    *H01L 21/285*     (2006.01)
    *H01L 21/02*      (2006.01)

(52) U.S. Cl.
    CPC .......... *C23C 16/46* (2013.01); *H01L 21/0262* (2013.01); *H01L 21/02271* (2013.01); *H01L 21/28506* (2013.01)

(58) Field of Classification Search
    USPC .......................................... 118/715, 724, 726
    See application file for complete search history.

(56) References Cited

U.S. PATENT DOCUMENTS

2007/0163502 A1*   7/2007   Nozawa .............. C23C 16/4411
                                                                                   118/723 R
2015/0093909 A1*   4/2015   Murata ............... C23C 16/4411
                                                                                  438/758

FOREIGN PATENT DOCUMENTS

| JP | 7-135182 A | 5/1995 |
| --- | --- | --- |
| JP | H07-135182 A | 5/1995 |
| JP | 2010-249507 A | 11/2010 |
| JP | 2011-103469 A | 5/2011 |
| KR | 10-2012-0005977 A | 1/2012 |

* cited by examiner

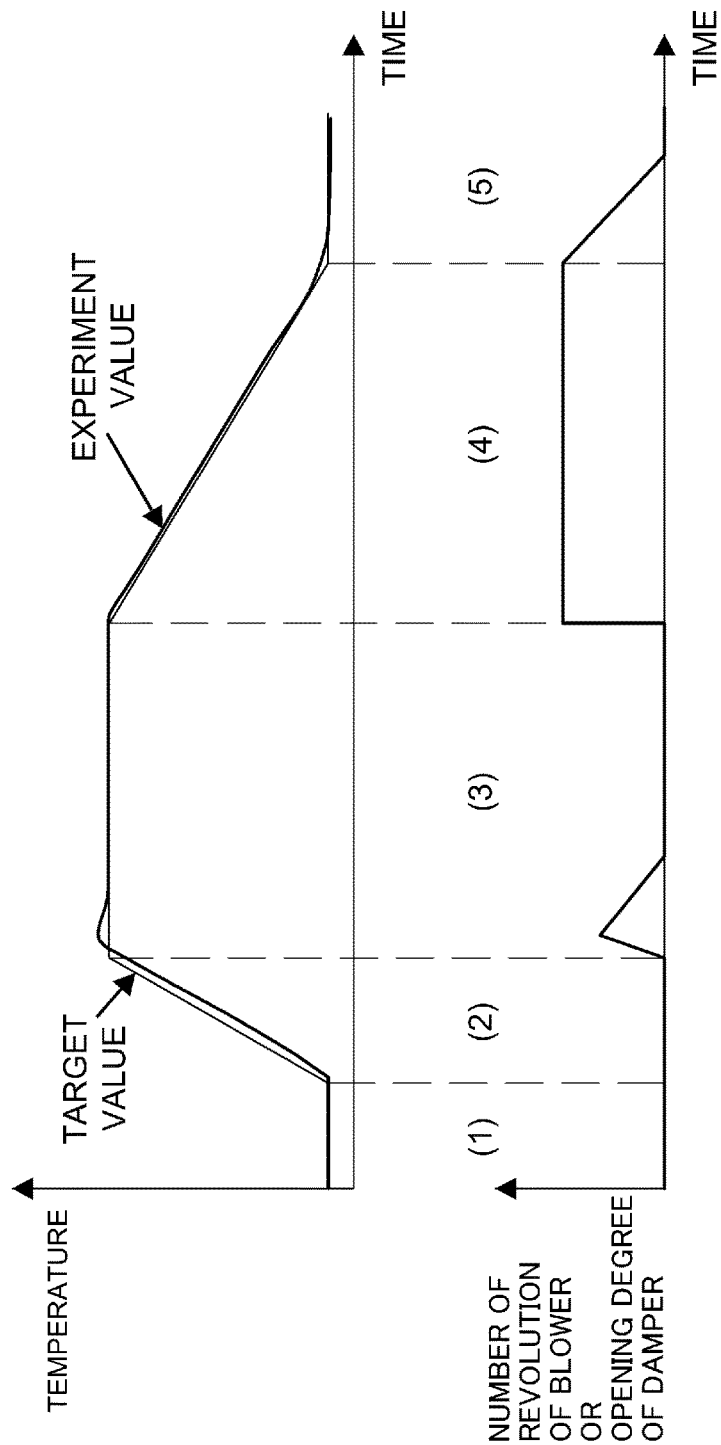

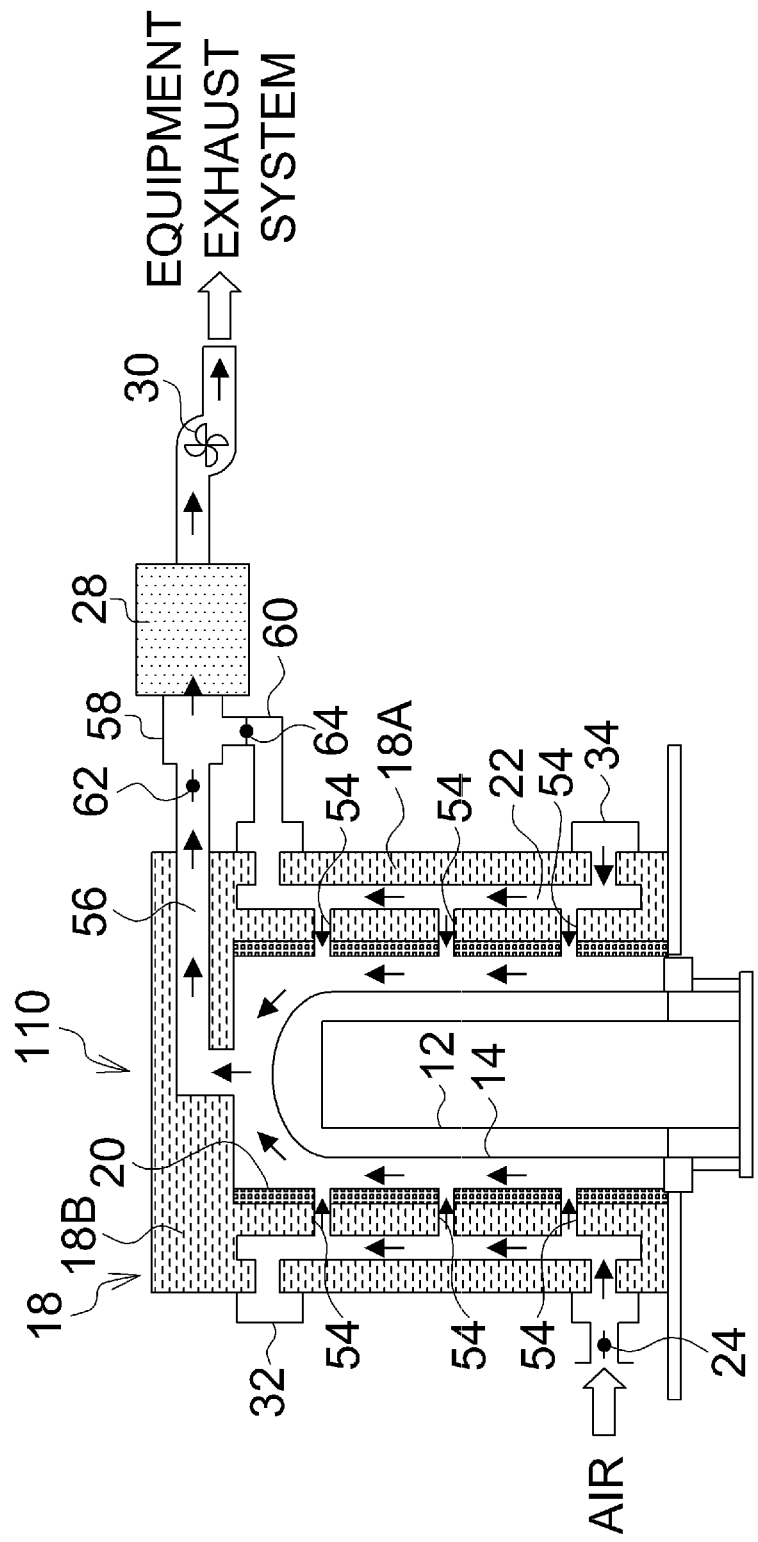

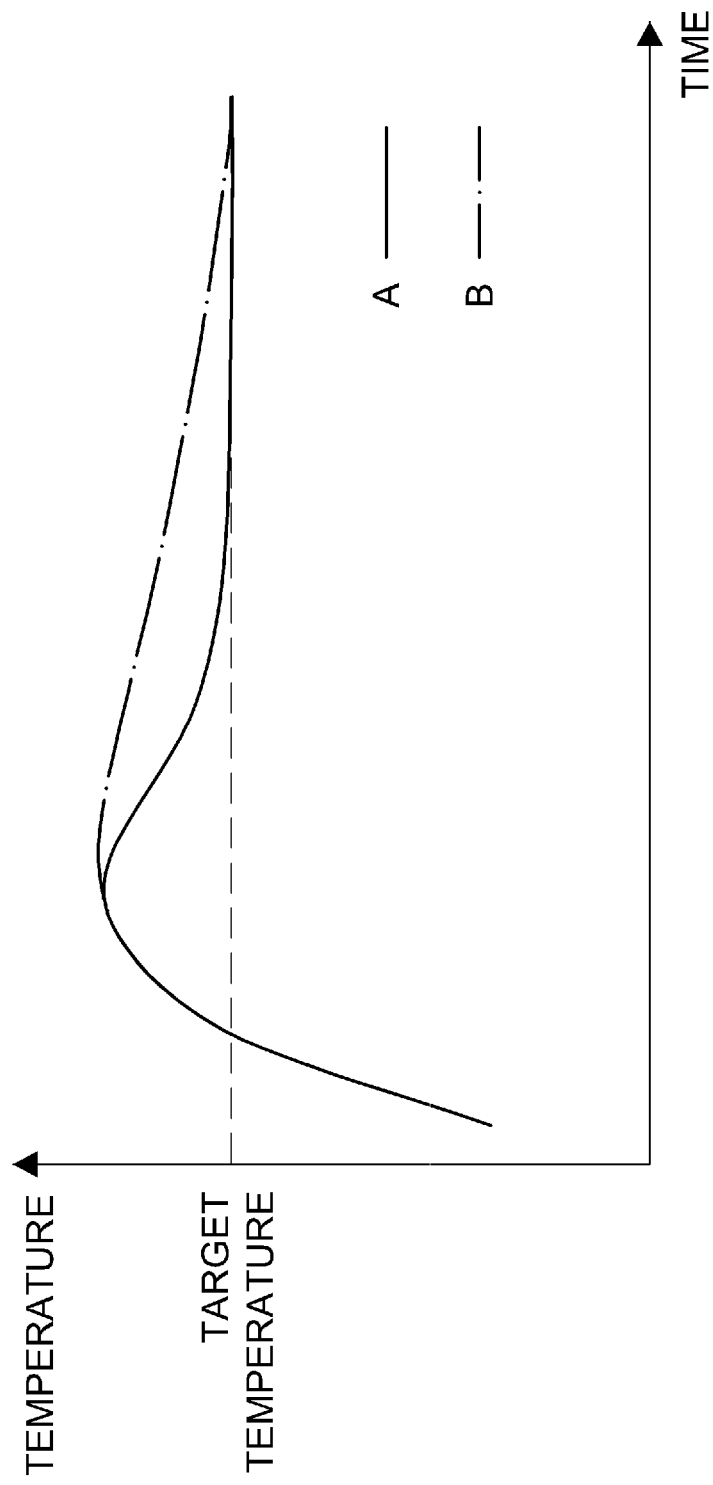

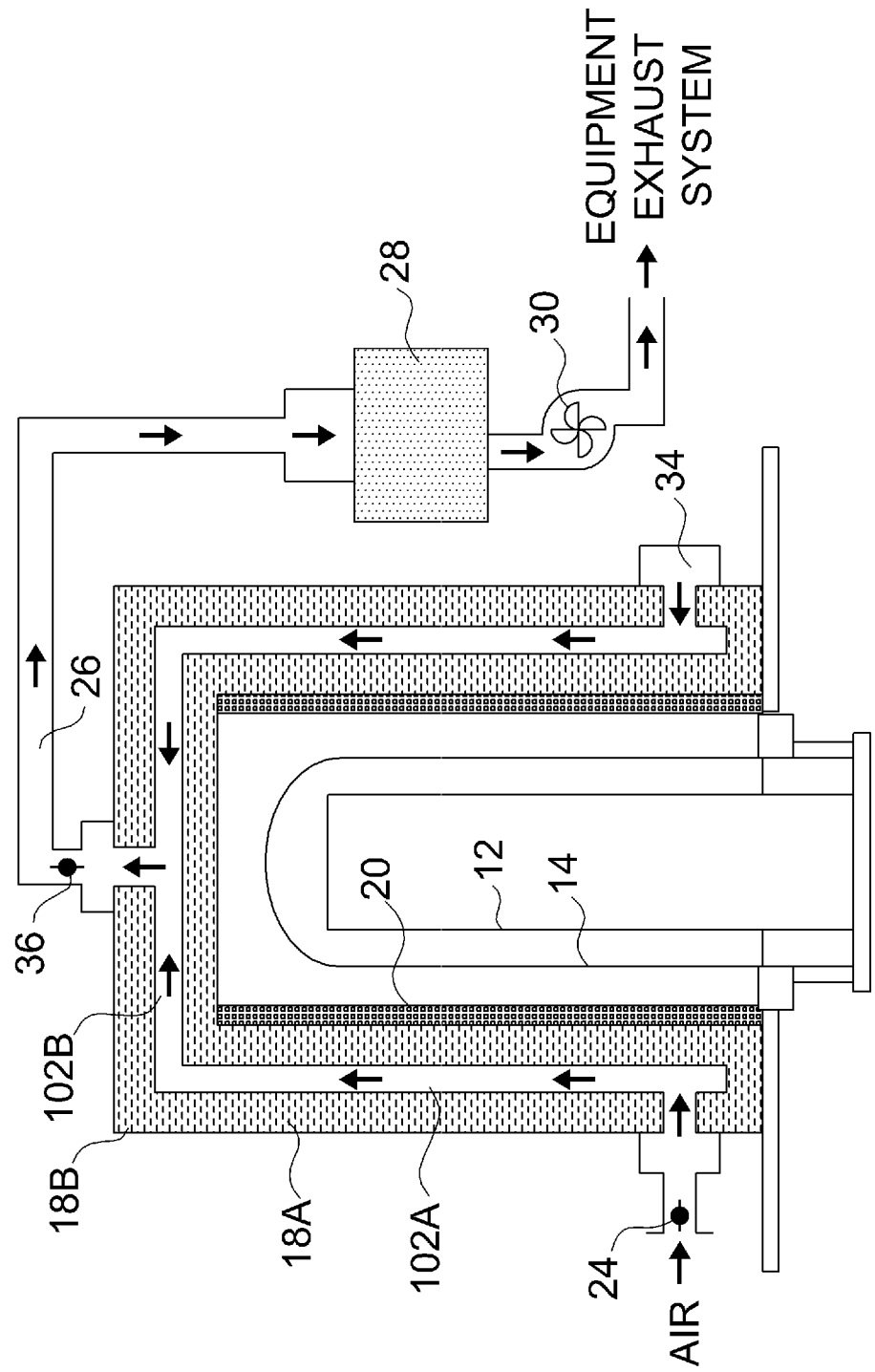

SUBSTRATE PROCESSING APPARATUS, METHOD OF MANUFACTURING SEMICONDUCTOR DEVICE AND METHOD OF PROCESSING SUBSTRATE

CROSS-REFERENCE TO RELATED PATENT APPLICATION

This U.S. non-provisional patent application claims priority under 35 U.S.C. §119 of Japanese Patent Application No. 2012-065698, filed on Mar. 22, 2012, in the Japanese Patent Office and International Application No. PCT/JP2013/058322, filed on Mar. 22, 2013, in the WIPO, the entire contents of which are hereby incorporated by reference.

BACKGROUND OF THE INVENTION

1. Field of the Invention

The present invention relates to a substrate processing apparatus and a method of processing a substrate, and more particularly, to a substrate processing apparatus and a method of processing a substrate such as a semiconductor wafer.

2. Description of the Related Art

As illustrated in FIGS. 8A and 8B, in general, a substrate processing apparatus includes an outer insulating layer a including a cylindrical wall surface, a reaction container c installed in the outer insulating layer a, a boat d installed in the reaction container c and on which a semiconductor wafer is loaded, and a heater b installed on an inner wall of the outer insulating layer a to heat the inside of the reaction container c.

In order to thermally process the semiconductor wafer in the substrate processing apparatus, the semiconductor wafer at room temperature is loaded in the reaction container c while being placed on the boat d, thermally processed by heating the semiconductor wafer to a predetermined temperature by the heater b, and cooled down to the room temperature, and then the boat d is moved downward.

The shorter a recipe time needed to perform a series of operations described above, the better the productivity of the substrate processing apparatus. To reduce the recipe time, temperature recovery characteristics which are temperature change characteristics when the semiconductor wafer is heated from the room temperature to a target temperature and is cooled from the target temperature to the room temperature are important. To improve the temperature recovery characteristics, a heat radiation property of the heater b should be improved.

FIG. 8A illustrates a substrate processing apparatus including an outer insulating layer a with thin wall surfaces. FIG. 8B illustrates a substrate processing apparatus including an outer insulating layer a with thick wall surfaces. In the substrate processing apparatus including the outer insulating layer a with the thin wall surfaces, a semiconductor wafer is heated to a temperature which is higher than a target temperature but is rapidly cooled to the target temperature as indicated by a solid line A in FIG. 9. In contrast, in the substrate processing apparatus including the outer insulating layer a with the thick wall surfaces, a semiconductor wafer is difficult to be cooled down. Thus, once the semiconductor wafer is heated to a temperature which is higher than the target temperature, the semiconductor wafer is difficult to be rapidly cooled down to the target temperature as indicated by an alternated long and short dash line B in FIG. 9.

However, in the substrate processing apparatus having the thin outer insulating layer a and high heat radiation properties, power consumption increases to compensate for heat radiated via a surface of the outer insulating layer a.

Conventionally, a technique of designing a heater with the outer insulating layer a having a predetermined thickness has been employed in consideration of a balance between the temperature recovery characteristics and power consumption. However, when the technique is employed, high temperature recovery characteristics or low power consumption should be given up or both the temperature recovery characteristics and power consumption should be controlled to an appropriate level. Accordingly, it is impossible to increase the temperature recovery characteristics while reducing power consumption.

To solve this problem, for example, a reaction container 3 is installed in a heater layer 2 including an outer insulating layer 1, a wafer loading means 5 on which a wafer 4 is loaded is inserted into the reaction container 3, an air flow channel 6 is installed between the heater layer 2 and the reaction container 3, a hollow air insulating layer 10 is installed between the outer insulating layer 1 and the heater layer 2 in a vertical diffusion chemical vapor deposition (CVD) furnace connected to an exhaust device 9 that exhausts air in the air flow channel 6 via an in-heater heat exhaust gate 7 and a radiator 8, and a heat exhaust gate 12 is installed at an air emission side of the hollow air insulating layer 10 communicating with the radiator 8 (see patent document 1).

PRIOR ART DOCUMENT

Patent Document

1. Japanese Unexamined Patent Application Publication No. Hei 5-067577

SUMMARY OF THE INVENTION

However, high temperature recovery characteristics and low power consumption cannot be accomplished at the same time with the vertical diffusion CVD furnace disclosed in patent document 1.

It is an object of the present invention to provide a substrate processing apparatus and a method of processing a substrate capable of achieving higher temperature recovery characteristics and lower power consumption than when the related art is used.

According to one aspect of the present invention, there is provided a substrate processing apparatus as recited in claim 1, the substrate processing apparatus including a vertical reaction container where a vertical boat having a substrate placed thereon is loaded; an insulating wall including therein a reaction container accommodation chamber wherein the insulating wall is made of an insulating material and configured to accommodate the reaction container; a heater installed in the reaction container accommodation chamber; an air circulation channel installed vertically in a sidewall of the insulating wall; an air circulation mechanism configured to distribute air upward or downward to the air circulation channel; a first valve installed at an inlet of the air circulation channel; a second valve installed at an outlet of the air circulation channel; and a control unit configured to control the heater, the air circulation mechanism, the first valve and the second valve to: circulate the air in the air circulation channel by the air circulation mechanism with the first valve and the second valve closed or to distribute the air in the air circulation channel by the air circulation mechanism with the first valve and the second valve open in a temperature elevating process of heating the substrate to a target temperature by the heater when a temperature of the substrate exceeds the target temperature; stop an operation of the air circulation mechanism with the first valve and the second valve closed when the temperature of the substrate is lowered to the target temperature; and distribute the air in the air circulation channel by the air circulation mechanism with the first valve and the second valve open in a temperature lowering process of lowering the temperature of the substrate to be less than the target temperature When the substrate is heated using the reaction container by the heater in the temperature elevating process, the temperature of the substrate increases to exceed the target temperature.

However, when the temperature of the substrate exceeds the target temperature in the temperature elevating process, the substrate processing apparatus circulates the air in the air circulation channel using the air circulation mechanism with the first valve and the second valve closed or distributes the air in the air circulation channel using the air circulation mechanism with the first valve and the second valve open. Thus, compared to when air is not circulated or distributed in the air circulation channel, the amount of heat radiated via wall surfaces of the air circulation channel is high and the insulating wall is thus rapidly cooled even when the wall surfaces of the insulating wall are thick. Accordingly, the substrate may be also rapidly cooled to the target temperature.

In the temperature elevating process, when the temperature of the substrate is lowered to the target temperature, the first valve and the second valve are closed to stop the operation of the air circulation mechanism. Thus, both the inlet and outlet of the air circulation channel are prevented from communicating with the outside and air circulation is stopped in the air circulation channel.

In addition to the insulating material forming the insulating wall, the air in the air circulation channel functions as an insulating material. Thus, a higher insulation property may be achieved than when the air circulation channel is not installed on the insulating wall.

Since the first valve and the second valve are open in the temperature lowering process, the air circulation channel may communicate with the air and an equipment exhaust system. Thus, when the air circulation mechanism is operated, low-temperature air may be introduced into the air circulation channel, pass through the air circulation channel, and be exhausted to the equipment exhaust system, thereby rapidly cooling the insulating wall.

Thus, with the substrate processing apparatus, higher temperature recovery characteristics may be achieved and power consumption may be suppressed, compared to the related art.

According to another aspect of the present invention, there is provided a method of manufacturing a semiconductor device as recited in claim 7 using a substrate processing apparatus including a reaction container where a substrate retainer having a substrate placed thereon is loaded, an insulating wall including therein a reaction container accommodation chamber wherein the insulating wall is made of an insulating material and configured to accommodate the reaction container, a heater installed in the reaction container accommodation chamber, an air circulation channel installed in a sidewall of the insulating wall, an air circulation mechanism configured to distribute air to the air circulation channel, an air cooling unit configured to cool the air circulating through the air circulation channel, a first valve installed at an inlet of the air circulation channel, and a second valve installed at an outlet of the air circulation channel, the method comprising:

(a) elevating a temperature of the substrate from room temperature to a target temperature;

(b) processing the substrate by introducing a predetermined source gas into the reaction container at the target temperature; and (c) lowering the temperature of the substrate to be less than the target temperature after the substrate reacts with the source gas, wherein in the step (a), the air is circulated in the air circulation channel using the air circulation mechanism with the first valve and the second valve closed or distributed in the air circulation channel using the air circulation mechanism with the first valve and the second valve open when the temperature of the substrate exceeds the target temperature, and an operation of the air circulation mechanism is stopped with the first valve and the second valve closed when the temperature of the substrate is lowered to the target temperature, and in the step (c), the air is distributed to the air circulation channel using the air circulation mechanism with the first valve and the second valve open.

wherein the step (a) comprises: circulating the air in the air circulation channel by the air circulation mechanism with the first valve and the second valve closed or distributing the air in the air circulation channel by the air circulation mechanism with the first valve and the second valve open when a temperature of the substrate exceeds the target temperature; and stopping an operation of the air circulation mechanism with the first valve and the second valve closed when the temperature of the substrate is lowered to the target temperature; and wherein the step (c) comprises distributing the air in the air circulation channel by the air circulation mechanism with the first valve and the second valve open.

In the method of manufacturing the semiconductor device, in the step (a), when the temperature of the substrate exceeds the target temperature, air is also distributed to the air circulation channel using an air circulation mechanism. Thus, the amount of heat radiated via wall surfaces of the air circulation channel is high, compared to when air is not distributed in the air circulation channel. Accordingly, the insulating wall is thus rapidly cooled even when the wall surfaces of the insulating wall are thick and the substrate is also rapidly cooled to the target temperature.

In the step (a), when the temperature of the substrate is lowered to the target temperature, the first valve and the second valve are closed to stop an operation of the air circulation mechanism. Thus, both the inlet and outlet of the air circulation channel are prevented from communicating with the outside and air circulation is stopped in the air circulation channel.

Thus, the air in the air circulation channel functions as an insulating material in addition to the insulating material forming the insulating wall.

In the step (b), the substrate is processed using a predetermined reactive gas while the first valve and the second valve are closed to stop the operation of the air circulation mechanism.

In the step (c), air is distributed to the air circulation channel using the air circulation mechanism with the first valve and the second valve open. Thus, the insulating wall may be rapidly cooled by the air introduced into the air circulation channel using the first valve.

As described above, with the method of manufacturing the semiconductor device, higher temperature recovery characteristics may be achieved and power consumption may be suppressed, compared to the related art.

According to still another aspect of the present invention, there is provided a method of processing a substrate as recited in claim 8, the method including:

(a) loading a substrate retainer having a substrate placed thereon into a reaction container;

(b) elevating an inner temperature of the reaction container to a predetermined temperature using an insulating wall made of an insulating material wherein the insulating wall includes a reaction container accommodation chamber for accommodating the reaction container therein, an air circulation channel installed in a sidewall thereof and configured to distribute or circulate air therein, an air circulation mechanism configured to distribute or circulate the air in the air circulation channel, a first valve installed at an inlet of the air circulation channel and a second valve installed at an outlet of the air circulation channel, and a heater installed between the insulating wall and the reaction container, (c) lowering the inner temperature of the reaction container to the predetermined temperature by controlling at least the heater, the first valve and the second valve to circulate the air in the air circulation channel with the first valve and the second valve closed or to distribute the air in the air circulation channel with the first valve and the second valve open when the inner temperature of the reaction container exceeds the predetermined temperature in the step (a); and (d) processing the substrate by controlling the first valve, the second valve and the air circulation mechanism to stop an operation of the air circulation mechanism with the first valve and the second valve closed causing the air to stay in the air circulation channel and maintaining the inner temperature of the reaction container constant after performing the step (c); and (e) lowering the inner temperature of the reaction container to be less than the predetermined temperature by distributing the air to the air circulation channel using the air circulation mechanism with the first valve and the second valve open after performing the step (d).

In the method, in the step (b), when the temperature of the substrate exceeds a target temperature, air is also distributed to the air circulation channel using an air circulation mechanism. Thus, the amount of heat radiated via wall surfaces of the air circulation channel is high, compared to when air is not distributed in the air circulation channel. Accordingly, the insulating wall is thus rapidly cooled even when the wall surfaces of the insulating wall are thick and the substrate is also rapidly cooled to the target temperature.

BRIEF DESCRIPTION OF THE DRAWINGS

FIGS. 4A and 4B are graphs illustrating a variation in temperature of a semiconductor wafer according to time and control profile of a blower in a temperature elevating process, a reaction process and a temperature lowering process of the substrate processing apparatuses according to the first and second embodiments of the present invention.

FIGS. 7A through 7C are diagrams illustrating operations of the substrate processing apparatus according to the second embodiment in a temperature elevating process, a reaction process and a temperature lowering process.

FIG. 9 is a graph illustrating temperature recovery characteristics of the substrate processing apparatuses of FIGS. 8A and 8B.

FIGS. 10A and 10B are diagrams illustrating examples of an air circulation channel of a substrate processing apparatus according to a third embodiment of the present invention.

DETAILED DESCRIPTION OF THE PREFERRED EMBODIMENTS

1. First Embodiment

A substrate processing apparatus 10 according to one embodiment of the present invention will be hereinafter described with reference to the accompanying drawings.

<Structure>

Figure 1:
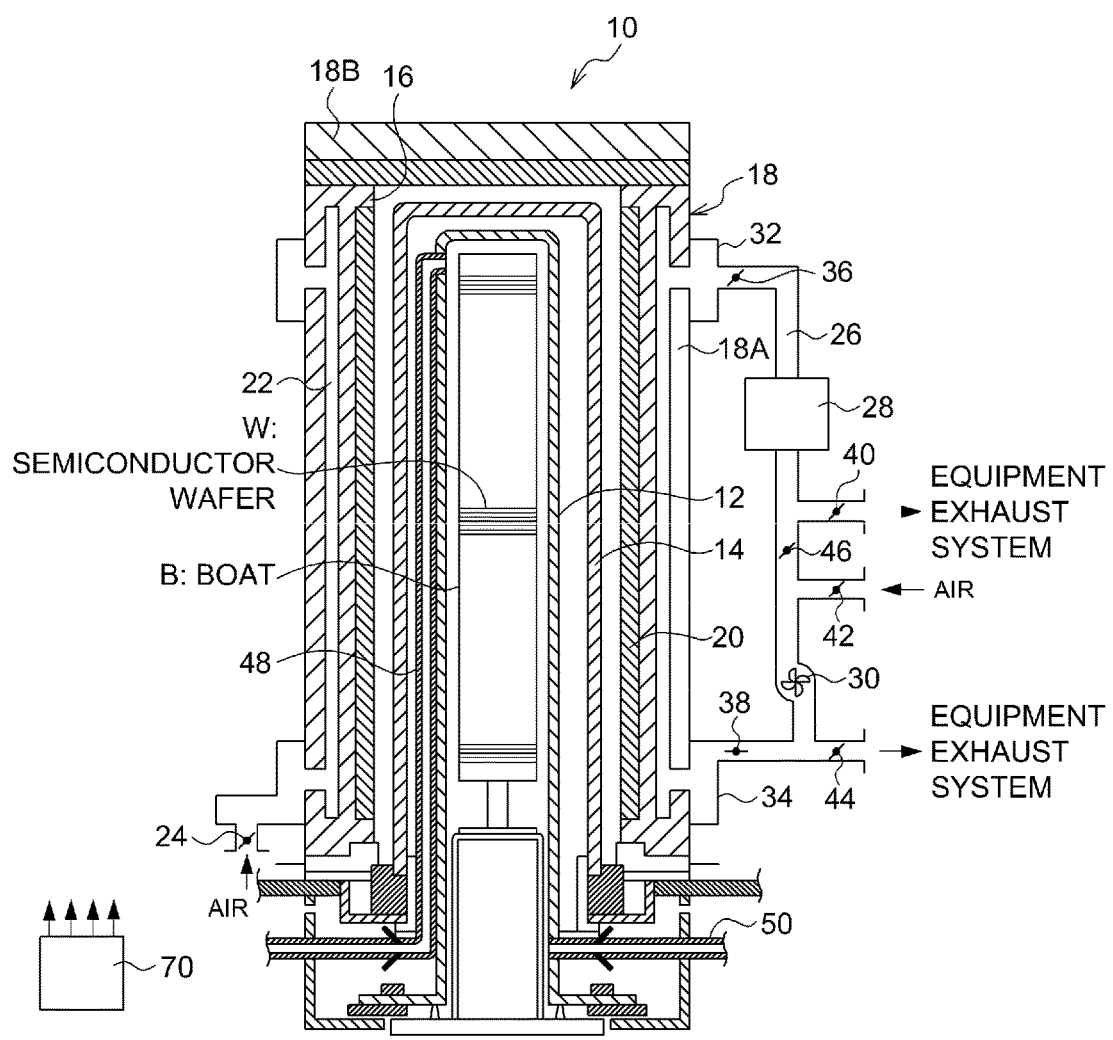
FIG. 1 is a cross-sectional view of an entire structure of a substrate processing apparatus according to a first embodiment of the present invention.

As illustrated in FIG. 1, the substrate processing apparatus 10 according to the first embodiment includes a reaction tube 12 having a vertical cylindrical shape (as an example of a reaction container) according to the present invention in which a boat B on which a semiconductor wafer W (as an example of a substrate) is placed is loaded; a liner tube 14 in which the reaction tube 12 is accommodated; an insulating wall 18 in which a reaction tube reception chamber 16 having a cylindrical shape (as an example of a reaction container accommodation chamber for accommodating the liner tube 14) is formed, and which includes a side surface insulating material 18A forming sidewall surfaces of the reaction tube reception chamber 16 and a ceiling surface insulating material 18B forming a ceiling surface of the reaction tube reception chamber 16; a heater 20 installed on an inner wall of the reaction tube reception chamber 16 of the insulating wall 18; an air distribution channel 22 formed in the side surface insulating material 18A vertically in a concentric form with an inner wall surface of the reaction tube reception chamber 16; an upper chamber 32 which is disposed on the air distribution channel 22 to communicate with the air distribution channel 22 and which forms a part of an air circulation channel 26 which will be described below; a lower chamber 34 which is disposed below the air distribution channel 22 to communicate with the air distribution channel 22 and which forms a part of the air circulation channel 26; and the air circulation channel 26 which communicates the upper chamber 32 and the lower chamber 34 with each other.

An intake valve 24 which communicates with the air is installed at the lower chamber 34.

On the air circulation channel 26, a radiator 28 is installed as an example of an air cooling means at a side of the upper chamber 32 and a blower 30 is installed as an air circulation mechanism at a side of the lower chamber 34.

At the air circulation channel 26, a valve 36 is installed between the upper chamber 32 and the radiator 28 and the valve 38 is installed between the blower 30 and the lower chamber 34. An exhaust valve 40 which is a valve communicating with an equipment exhaust system and an intake valve 42 which is a valve communicating with the air are installed between the radiator 28 and the blower 30. Also, an exhaust valve 44 which is a valve communicating with an equipment exhaust system is installed between the blower 30 and the valve 38, and a valve 46 is installed between the exhaust valve 44 and the intake valve 42.

In the substrate processing apparatus 10, the intake valves 24 and 42 and the valve 38 correspond to a first valve according to the present invention, and the exhaust valves 40 and 44, and the valve 36 correspond to a second valve according to the present invention.

Also, in the substrate processing apparatus 10, a reactive gas introduction pipe channel 48 via which a reactive gas is introduced and a reactive gas emission pipe channel 50 via which the reactive gas introduced into the reaction tube 12 is emitted to the outside of the reaction tube 12 are installed in the reaction tube 12.

Also, in the substrate processing apparatus 10, a control unit 70 is installed to control the heater 20, the intake valves 24 and 42, the valves 36, 38 and 46, the exhaust valves 40 and 44, the radiator 28 and the blower 30.

<Operations>

Figure 2:
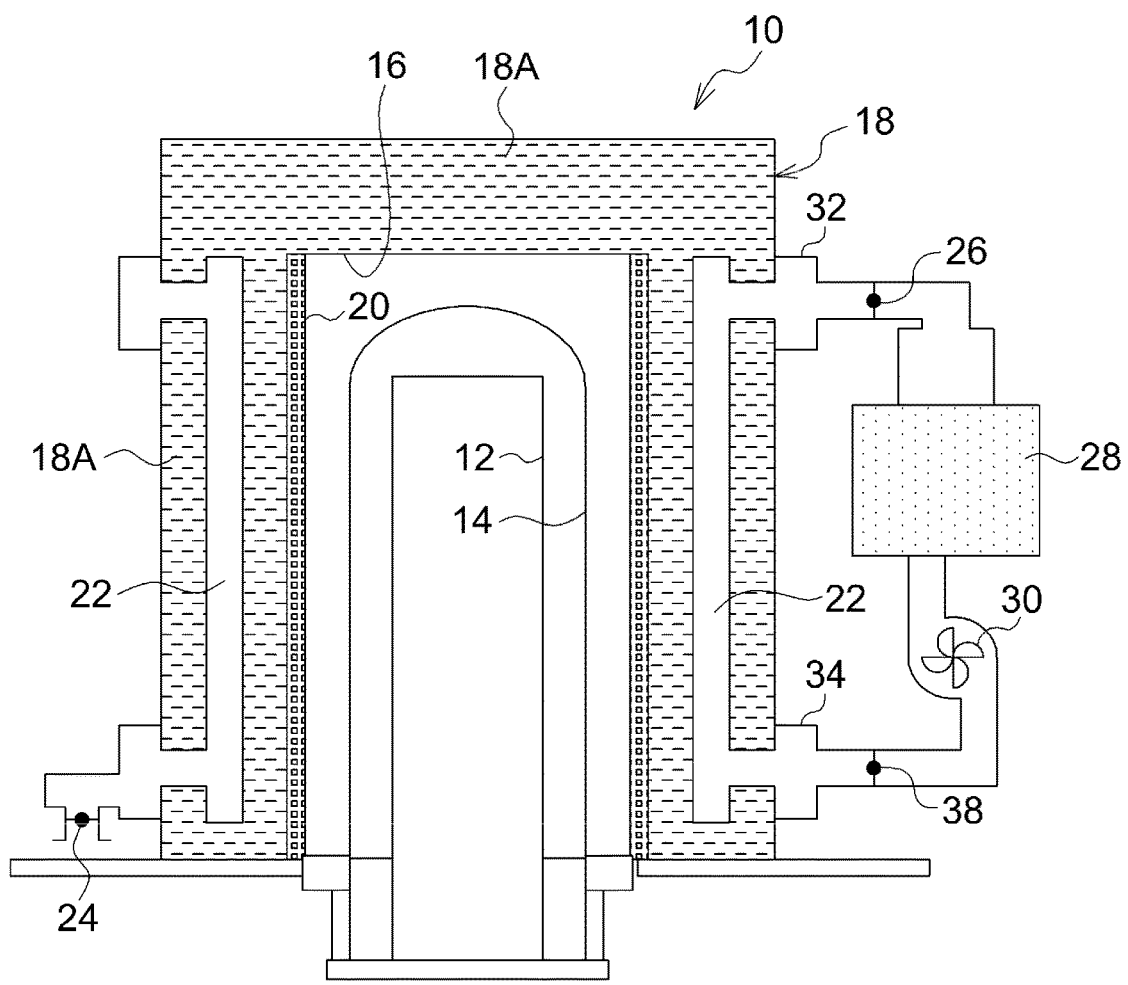
FIG. 2 is a diagram illustrating operations of a substrate processing apparatus according to the first embodiment when temperature of a semiconductor wafer is raised in a temperature elevating process and when the temperature of the semiconductor wafer is stabilized at a target temperature.

Operations of the substrate processing apparatus 10 will be described below. In a temperature elevating process, temperature of the semiconductor wafer W begins to be raised, and the control unit 70 closes the intake valve 24, the valve 36 and the valve 38 until temperature in the reaction tube 12 (in other words, the temperature of the semiconductor wafer W) reaches a target temperature as illustrated in FIG. 2. In this case, the radiator 28 may be stopped but is preferably in a drive state to rapidly raise the temperature of the semiconductor wafer W. The blower 30 is preferably stopped to reduce power consumption.

Thus, the air distribution channel 22 is prevented from communicating with the air and the equipment exhaust system, thereby stopping distribution of air in the air distribution channel 22.

Thus, since the air in the air distribution channel 22 functions as an insulating material in addition to the insulating material forming the insulating wall 18, the temperature in the reaction tube 12 also sharply increases as shown in a time period 2 of FIG. 4A.

Figure 3A:
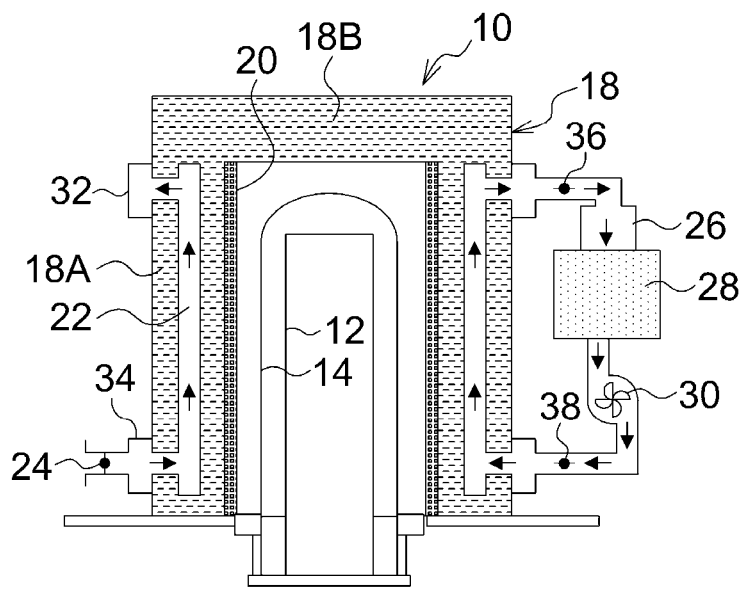
FIGS. 3A through 3C are diagrams illustrating operations of the substrate processing apparatus according to the first embodiment when temperature recovery is performed in a temperature elevating process and during a temperature lowering process.

When the temperature in the reaction tube 12 exceeds the target temperature, the control unit 70 activates the blower 30 by opening the valve 36 and the valve 38 with the intake valve 24 closed, as illustrated in FIG. 3A. Also, the exhaust valves 40 and 44 and the intake valve 42 are in a closed state in this case.

Thus, as indicated by an arrow in FIG. 3A, air sequentially circulates through the lower chamber 34, the air distribution channel 22, the upper chamber 32, the air circulation channel 26 and the lower chamber 34, and then passes through the air circulation channel 26 to be cooled by the radiator 28. Thus, the temperature of the side surface insulating material 18A of the insulating wall 18 is rapidly cooled by the air circulating through the air distribution channel 22. Thus, the reaction tube reception chamber 16 and the reaction tube 12 are also rapidly cooled to sharply decrease the temperature in the reaction tube 12 (in other words, the temperature of the semiconductor wafer W) as shown in a time period 4 of FIG. 4A.

Here, the amount of heat radiated through a wall surface of the air distribution channel 22 varies according to the amount of the air passing through the air distribution channel 22. As a representative example, in a case that air distributing through the air distribution channel 22 is a laminar flow and the temperature of a wall surface of the air distribution channel 22 is sharply cooled as described above, a heat transfer correlation of $Nux=0.332Rex^{1/2}Pr^{1/3}$ is established. Nusselt number Nux, Reynolds number Rex and Prandtl number Pr satisfy following equations:

$$Nux=(hx \cdot x)/\pi$$

$$Rex=u \cdot x/v$$

$$Pr=v/a$$

where hx denotes a thermal conductivity, x denotes a reference length, $\pi$ denotes a thermal conductivity, u denotes temperature, v denotes a coefficient of kinematic viscosity, and a denotes temperature conductivity.

Thus, in order to change a heat insulation property of the insulating wall 18, the amount of air distributing through the air distribution channel 22 may be changed. To this end, the control unit 70 may control the number of revolutions of the blower 30 or the opening degrees of the valves 36 and 38. The valves 36 and 38 may be embodied as dampers. The temperature recovery characteristics and power consumption may be optimally controlled by changing the heat insulation property of the insulating wall 18 step by step or continuously as described above.

Also, when the temperature of the semiconductor wafer W comes close to the target temperature, the control unit 70 may gradually reduce the number of revolutions of the blower 30 to decrease undershoot and cause the temperature of the semiconductor wafer W to rapidly reach the target temperature.

Also, the control unit 70 may set predetermined values of the number of revolutions of the blower 30 or the opening degrees of the valves 36 and 38 through sequence control, based on a predetermined temperature recipe or may PID-control the number of revolutions of the blower 30 or the opening degrees of the valves 36 and 38 by monitoring temperature by internally dividing the reaction tube 12.

Figure 3B:
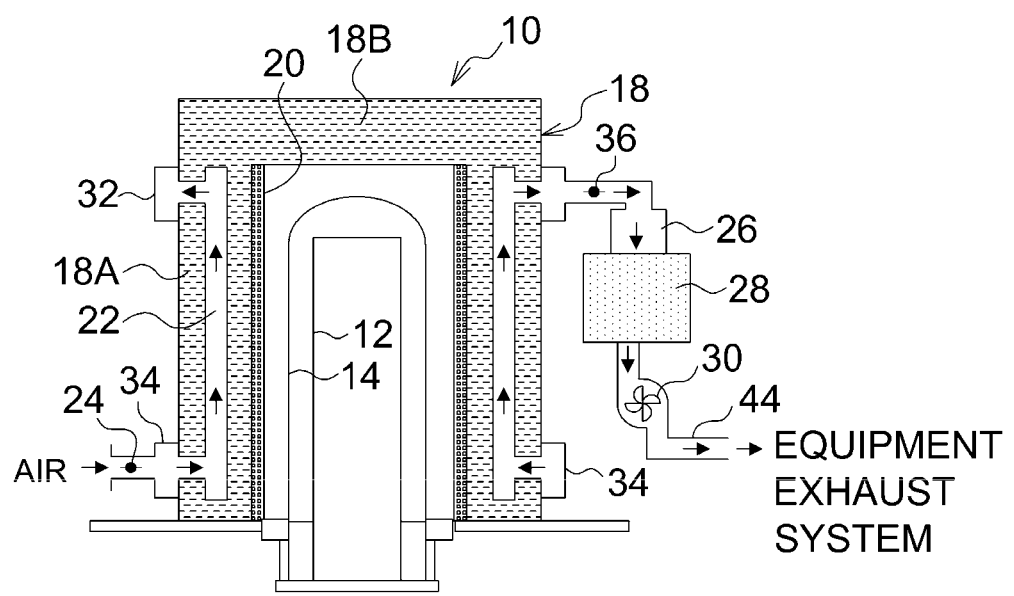

When the temperature in the reaction tube 12 exceeds the target temperature, the intake valve 24, the valve 36, the valve 46 and the exhaust valve 44 may be opened as illustrated in FIG. 3B rather than setting the air distribution channel 22 and the air circulation channel 26 in an air circulation state as illustrated in FIG. 3A. In this case, the valve 38, the exhaust valve 40 and the intake valve 42 are in a closed state. Thus, since the air in the air circulation channel 26 is discharged to the equipment exhaust system by the blower 30 via the exhaust valve 44 as indicated by an arrow in FIG. 3B, the air flows into the lower chamber 34 via the intake valve 24, distributes through the air distribution channel 22 upward from below, and then flows into the upper chamber 32.

Figure 3C:
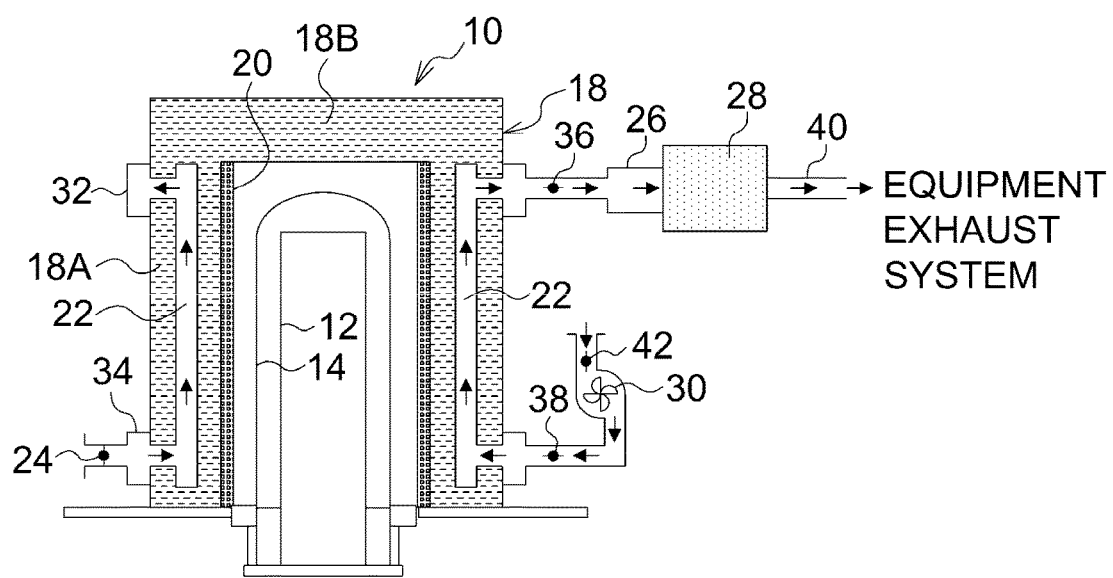

Alternatively, the valve 36, the valve 38, the exhaust valve 40 and the intake valve 42 may be opened as illustrated in FIG. 3C rather than setting a discharge state in which the air is discharged in the air circulation channel 26 to the equipment exhaust system as illustrated in FIG. 3B. In this case, the intake valve 24 and the valve 46 are in a closed state. Thus, as indicated by an arrow in FIG. 3C, the air is inhaled by the blower 30 via the intake valve 42, is compressed in the lower chamber 34, distributes upward through the air distribution channel 22, arrives at the upper chamber 32, and is then discharged to the equipment exhaust system through the radiator 28 via the exhaust valve 44.

In the air circulation state illustrated in FIG. 3A, air is simply circulated through the air distribution channel 22 and the air circulation channel 26 without being discharged to the outside, thereby saving energy without weighing burden on factory equipment. In the discharge state illustrated in FIG. 3B and a compressed state in which the air is compressed in the lower chamber 34 illustrated in FIG. 3C, the radiator 28 may be stopped or omitted when an exhaust temperature is low.

When the temperature of the semiconductor wafer W is lowered to the target temperature, the control unit 70 stops the blower 30 and closes all the intake valve 24, the valve 36, the valve 38, the exhaust valve 40, the intake valve 42 and the exhaust valve 44 again as illustrated in FIG. 2.

Thus, the air distribution channel 22 is prevented from communicating with the air and the equipment exhaust system and thus air circulation is also prevented from occurring in the air distribution channel 22.

Accordingly, since the air in the air distribution channel 22 functions as an insulating material in addition to the insulating material forming the insulating wall 18, the temperature of the semiconductor wafer W is stabilized at the target temperature as shown in a time period 3 of FIG. 4A. In this state, a reaction process is performed and a source gas is introduced into the reaction tube 12 via the source gas introduction pipe channel 48 to be reacted with the semiconductor wafer W.

When the semiconductor wafer W is reacted with the source gas for a predetermined time, a temperature-lowering process is performed. In the temperature-lowering process, the control unit 70 switches the intake valve 24, the valve 36, the valve 38, the exhaust valve 40, the intake valve 42, the exhaust valve 44 and the valve 46 to cause the substrate processing apparatus 10 to be in the discharge state of FIG. 3B or the compressed state of FIG. 3C, and runs the blower 30 by electric power as illustrated in FIG. 4B. Thus, the temperature of the semiconductor wafer W is rapidly lowered as shown in a time period 4 of FIG. 4A.

When the temperature of the semiconductor wafer W is lowered to room temperature, the control unit 70 gradually stops the blower 30 and closes all the intake valve 24, the valve 36, the valve 38, the exhaust valve 40, the intake valve 42 and the exhaust valve 44 as illustrated in FIG. 2.

In the substrate processing apparatus 10, when the temperature of the semiconductor wafer W exceeds the target temperature in the temperature elevating process, the intake valve 24, the valve 36, the valve 38, the exhaust valve 40, the intake valve 42, the exhaust valve 44 and the valve 46 are switched to cool air by the radiator 28 while circulating the air between the air distribution channel 22 and the air distribution channel 26 as illustrated in FIG. 3A or the air is introduced, distributed through the air distribution channel 22, and then exhausted to the equipment exhaust system as illustrated in FIG. 3B or 3C. Thus, the temperature of the semiconductor wafer W is lowered to the target temperature within a short time. When the temperature of the semiconductor wafer W is lowered to the target temperature, all of the intake valve 24, the valve 36, the valve 38, the exhaust valve 40, the intake valve 42 and the exhaust valve 44 are closed as illustrated in FIG. 2, and the air distribution channel 22 is prevented from communicating with the air and the equipment exhaust system. Thus, the temperature recovery characteristics of the substrate processing apparatus 10 may be improved while saving power, as is apparent from in FIG. 4A illustrating that an experiment value of the temperature of the semiconductor wafer W indicated by a thick line is substantially the same as a target value indicated by a thin line.

Also, in the states of FIGS. 3A through 3C, the speed of revolutions of the blower 30 or the opening degrees of the valves 36 and 38 are controlled to adjust the amount of air circulation within the air distribution channel 22. Accordingly, the heat insulation property of the side surface insulating material 18A may be controlled according to a temperature recovery state, Also, when a cross-section area and wall surface area of the air distribution channel 22 are increased in the side surface insulating material 18A, the heat insulation property of the side surface insulating material 18A may be greatly influenced by the distribution of air through the air distribution channel 22. In contrast, when the cross-section area and wall surface area of the air distribution channel 22 are reduced, the heat insulation property of the side surface insulating material 18A may be slightly influenced by the distribution of air through the air distribution channel 22 but may be improved more when the air circulation is stopped in the air distribution channel 22. Thus, it is easy to optimally design the substrate processing apparatus 10 according to the purpose thereof.

2. Second Embodiment

A substrate processing apparatus according to another embodiment of the present invention will be described with reference to the accompanying drawings below. In FIGS. 5 to 9, reference numerals that are the same as those in FIGS. 1 to 4B denote the same elements as those in FIGS. 1 to 4B except for a special case.

<Structure>

Figure 5:
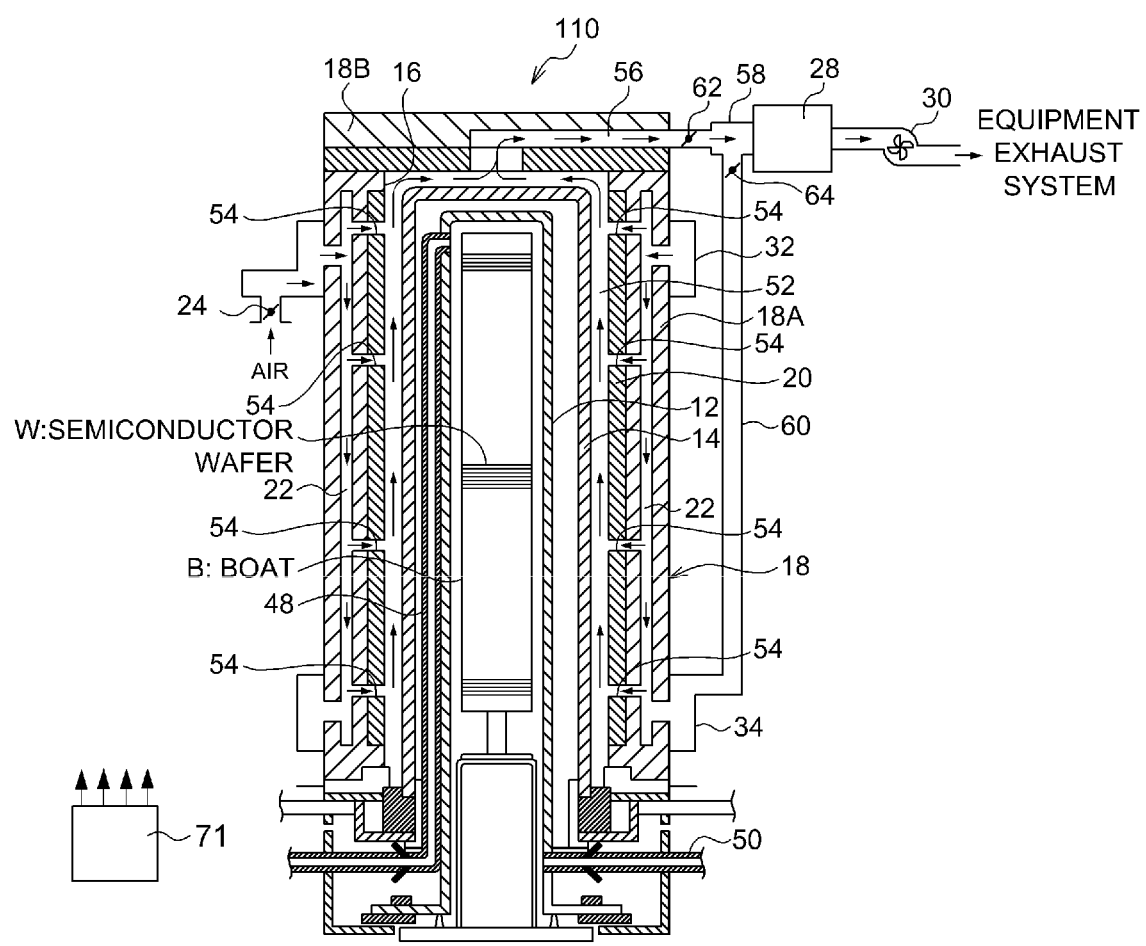
FIG. 5 is a cross-sectional view of an entire structure of the substrate processing apparatus according to the second embodiment.

As illustrated in FIG. 5, in a substrate processing apparatus 110 according to the present invention, a space between an inner wall surface of an side surface insulating material 18A and a liner tube 14 is used as a rapid cooling channel 52, and a communication flow channel 54 communicating the rapid cooling channel 52 and an air distribution channel 22 passes through a portion of a wall surface of the side surface insulating material 18A between the air distribution channel 22 and the rapid cooling channel 52 and a heater 20.

A rapid cooling exhaust channel 56 is installed at a ceiling surface insulating material 18B. The rapid cooling exhaust channel 56 is open in a ceiling surface of a reaction tube reception chamber 16 and communicates with the rapid cooling channel 52. The rapid cooling exhaust channel 56 communicates with an exhaust flow channel 58 at an outer side of an insulating wall 18. The exhaust flow channel 58 is a flow channel for exhausting air discharged via the rapid cooling channel 52 to an equipment exhaust system. In the exhaust flow channel 58, a radiator 28 and a blower 30 are installed.

Figure 6A:
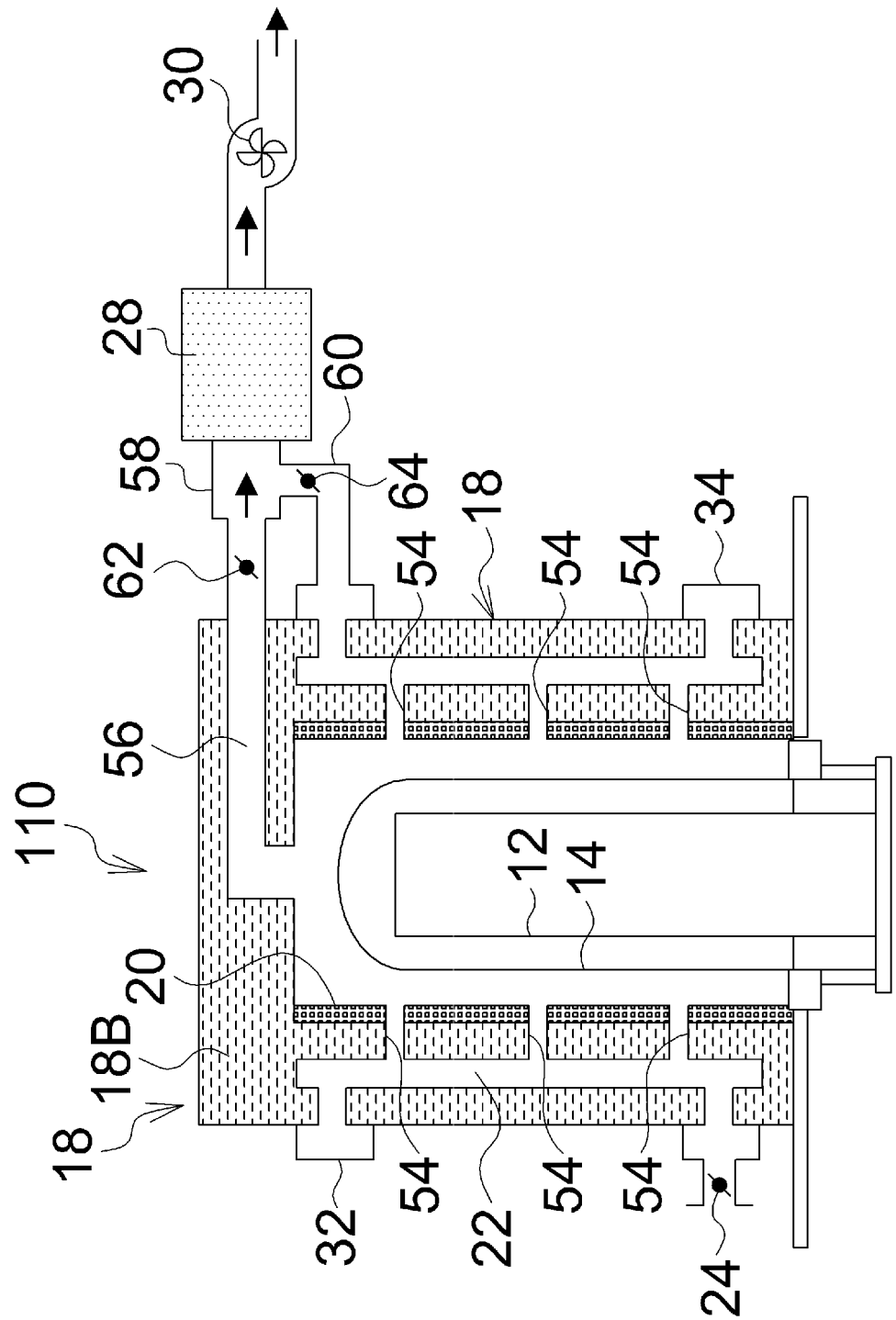
FIGS. 6A and 6B are schematic cross-sectional views of modified examples of the substrate processing apparatus according to the second embodiment.
Figure 6B:
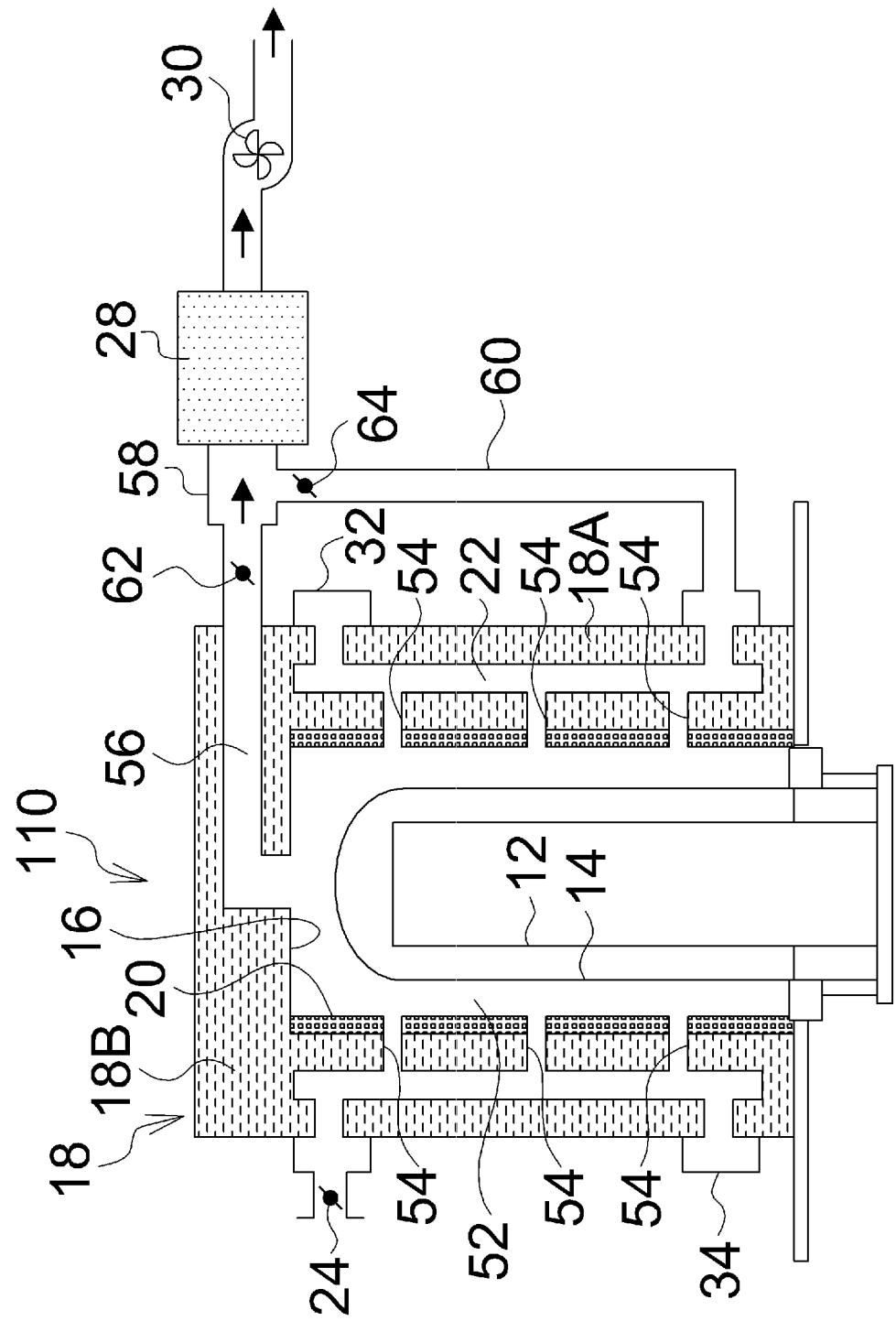

As illustrated in FIGS. 5 and 6B, in the substrate processing apparatus 110, an intake valve 24 is installed in an upper chamber 32 and a recovery flow channel 60 is connected to a lower chamber 34. The recovery flow channel 60 communicates with the exhaust flow channel 58 in front of the radiator 28. However, as illustrated in FIG. 6A, the intake valve 24 may be installed in the lower chamber 34 and the recovery flow channel 60 may be connected to the upper chamber 32.

As illustrated in FIGS. 5, 6A and 6B, a quenching exhaust valve 62 is installed at a portion of the exhaust flow channel 58 between the rapid cooling exhaust channel 56 and the radiator 28, and a recovery valve 64 is installed near a junction between the recovery flow channel 60 and the exhaust flow channel 58. The intake valve 24 and the recovery valve 64 correspond to a first valve and a second valve according to the present invention, respectively.

The substrate processing apparatus 110 includes a control unit 71 which controls the heater 20, the intake valve 24, the recovery valve 64, the radiator 28 and the blower 30.

The substrate processing apparatus 110 has the same structure as the substrate processing apparatus 10 according to the first embodiment except for the above description.

<Operations>

Figure 7A:
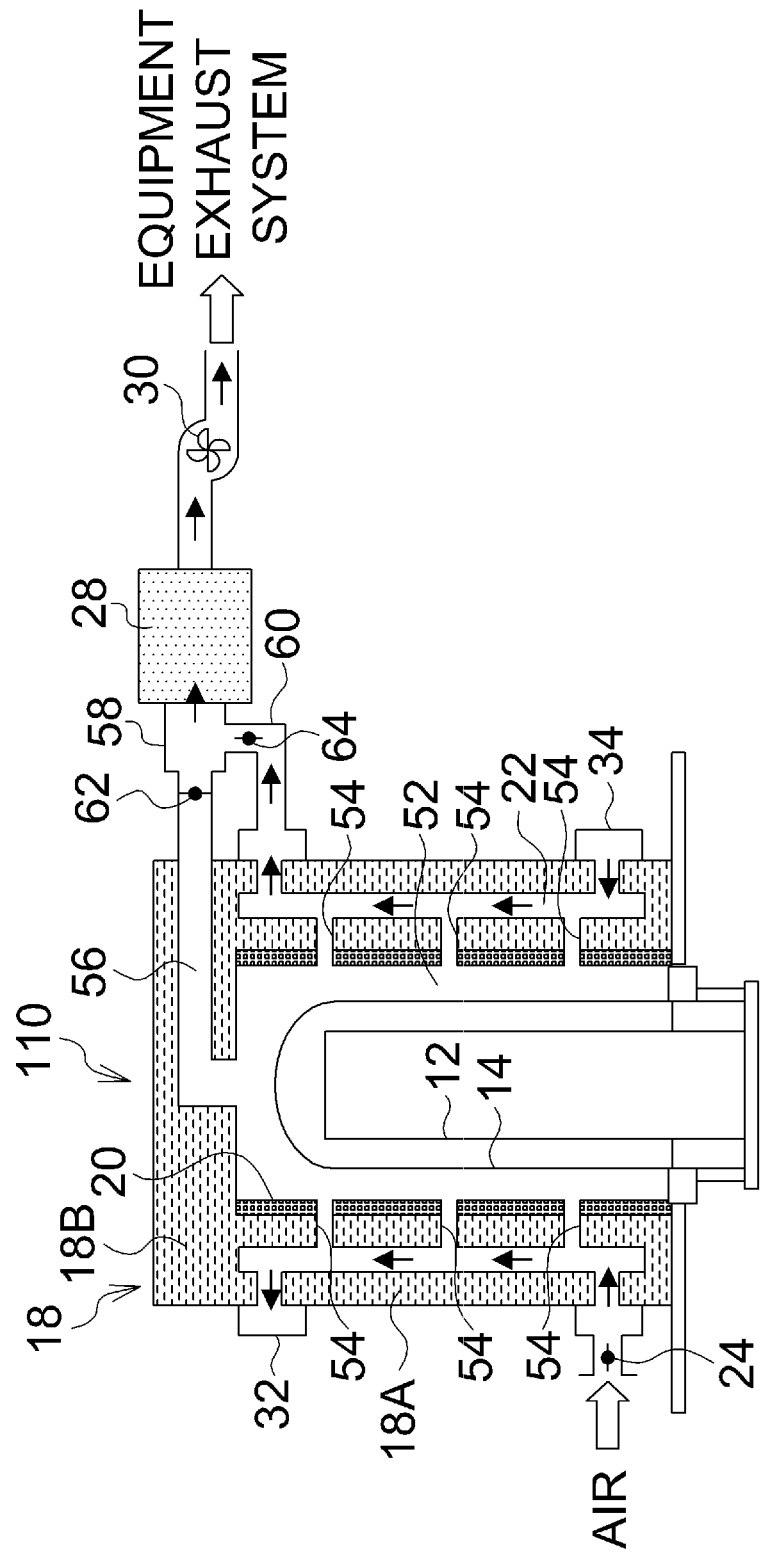
Figure 7B:
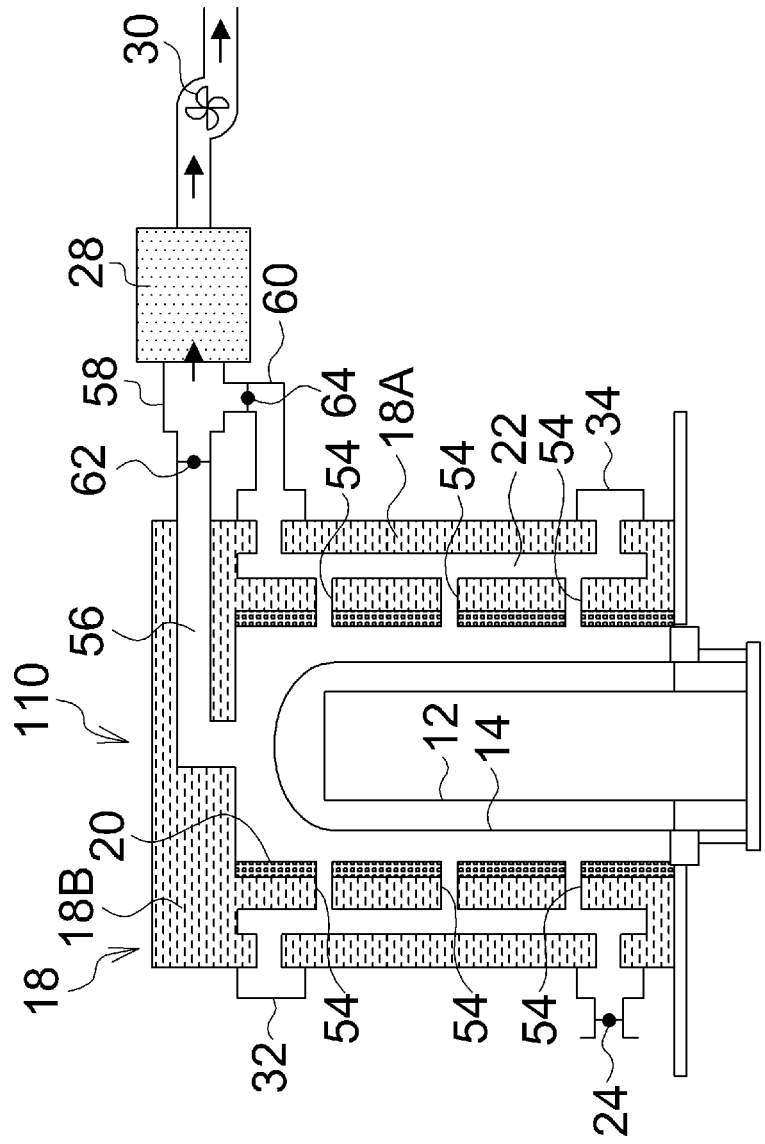
Figure 8A:
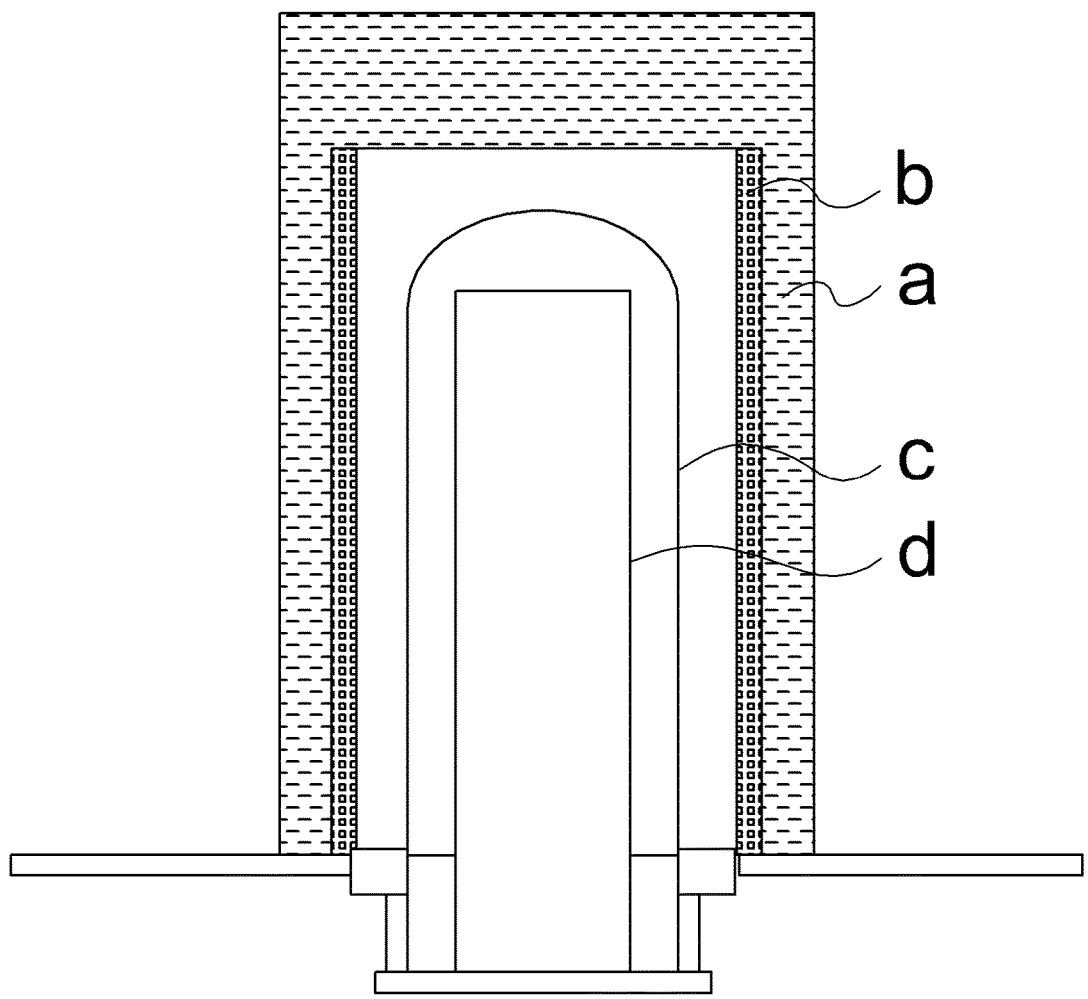
FIGS. 8A and 8B are schematic cross-sectional views of structures of examples of a substrate processing apparatus according to the related art.
Figure 8B:
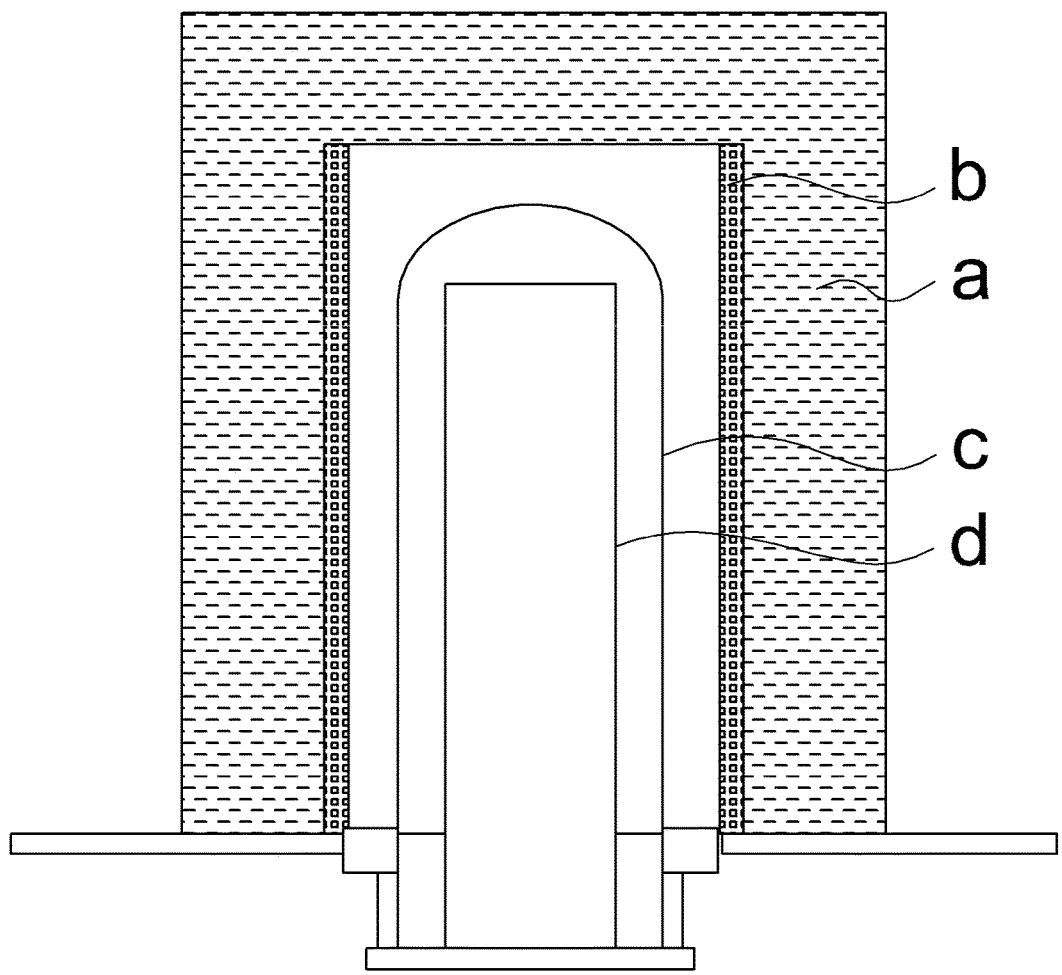

Operations of the substrate processing apparatus 110 will be described below. In a temperature elevating process, temperature of a semiconductor wafer W begins to be raised and the control unit 71 closes all the intake valve 24, the quenching exhaust valve 62 and the recovery valve 64 as illustrated in FIG. 7B until temperature in a reaction tube 12 (in other words, the temperature of the semiconductor wafer W) reaches a target temperature. In this case, the radiator 28 may be stopped but is preferably in a drive state to rapidly raise the temperature of the semiconductor wafer W. Also, the blower 30 is preferably stopped to reduce power consumption. FIGS. 7A through 7C illustrate a substrate processing apparatus 110 in which the intake valve 24 of FIG. 6A is installed in the lower chamber 34.

Thus, the air distribution channel 22 and the rapid cooling channel 52 are prevented from communicating with the air and an equipment exhaust system. Thus, air circulation is stopped in the air distribution channel 22 and the rapid cooling channel 52.

In addition to an insulating material forming the insulating wall 18, air in the air distribution channel 22 and the rapid cooling channel 52 also functions as an insulating material. Thus, the temperature in the reaction tube 12 sharply increases as shown in the time period 2 of FIG. 4A.

When the temperature in the reaction tube 12 exceeds the target temperature, the control unit 71 activates the blower 30 by opening the intake valve 24 and the recovery valve 64 with the quenching exhaust valve 62 closed as illustrated in FIG. 7A.

Thus, as indicated by an arrow in FIG. 7A, air is introduced into the lower chamber 34 via the intake valve 24, sequentially passes through the lower chamber 34, the air distribution channel 22, the upper chamber 32, the recovery flow channel 60 and the exhaust flow channel 58, is cooled by the radiator 28, and is then discharged to the equipment exhaust system. Thus, the side surface insulating material 18A of the insulating wall 18 is rapidly cooled by air distributing through the air distribution channel 22 to lower temperature thereof. Thus, as shown in the time period 3 of FIG. 4A, the temperature in the reaction tube 12 (in other words, the temperature of the semiconductor wafer W) is also rapidly lowered.

When the temperature of the semiconductor wafer W is lowered to the target temperature, the control unit 71 stops the blower 30 and closes the intake valve 24 and the recovery valve 64 to return to the state of FIG. 7B. Thus, the air distribution channel 22 is prevented from communicating with the air and the equipment exhaust system, thereby preventing air from distributing in the air distribution channel 22.

Thus, the air distribution channel 22 and the rapid cooling channel 52 are prevented from communicating with the air and the equipment exhaust system and thus air circulation is also stopped in the air distribution channel 22 and the rapid cooling channel 52.

Thus, in addition to the insulating material forming the insulating wall 18, air in the air distribution channel 22 and the rapid cooling channel 52 functions as an insulating material, thereby stabilizing the temperature of the semiconductor wafer W at the target temperature as shown in the time period 3 of FIG. 4A. Under this condition, a reaction process is performed and a source gas is introduced into the reaction tube 12 via a source gas introduction pipe channel 48 to react the semiconductor wafer W with the source gas.

When the semiconductor wafer W is reacted with the source gas for a predetermined time, a temperature lowering process is performed. In the temperature lowering process, the control unit 71 runs the blower 30 by electric power as illustrated in FIG. 4B by opening all the intake valve 24, the quenching exhaust valve 62 and the recovery valve 64 as illustrated in FIG. 7C. Thus, as indicated by an arrow in FIG. 7C, air is introduced into the lower chamber 34 via the intake valve 24 and sequentially passes through the lower chamber 34, the air distribution channel 22, the upper chamber 32, the recovery flow channel 60 and the exhaust flow channel 58. A part of the air introduced from the lower chamber 34 to the air distribution channel 22 passes through the communication flow channel 54, flows into the rapid cooling channel 52, passes through the rapid cooling exhaust channel 56, and is mixed with air passing through the recovery flow channel 60 in a portion of the exhaust flow channel 58 ahead of the radiator 28. The mixture of the airs passes through the radiator 28 and the blower 30 and is then exhausted to the equipment exhaust system. Thus, as shown in the time period 4 of FIG. 4A, the temperature of the semiconductor wafer W is rapidly lowered.

The substrate processing apparatus 110 is configured to include not only the air distribution channel 22 but also the rapid cooling channel 52, the rapid cooling exhaust channel 56 and the communication flow channel 54. Thus, in the temperature lowering process, the air introduced via the intake valve 24 distributes not only through the air distribution channel 22 in the side surface insulating material 18A but also along the liner tube 14 by opening the quenching exhaust valve 62 together with the recovery valve 64. Thus, the characteristics of the substrate processing apparatus 10 according to the first embodiment may be improved, and the temperature in the reaction tube 12 (i.e., the temperature of the semiconductor wafer W) may be very rapidly lowered in the temperature lowering process.

3. Third Embodiment

A third embodiment of the present invention will be described with reference to FIGS. 10A and 10B. In the third embodiment of FIGS. 10A and 10B, an air distribution channel 102B is further installed in a ceiling surface insulating material 18B, as well as a side surface insulating material 18A, compared to the first embodiment of FIG. 2 in which the air distribution channel 22 is installed in the side surface insulating material 18A. Also, in FIGS. 10A and 10B, reference numerals that are the same as those in FIGS. 1 to 3C denote the same elements as those illustrated in FIGS. 1 to 3C except for a special case.

Figure 10B:
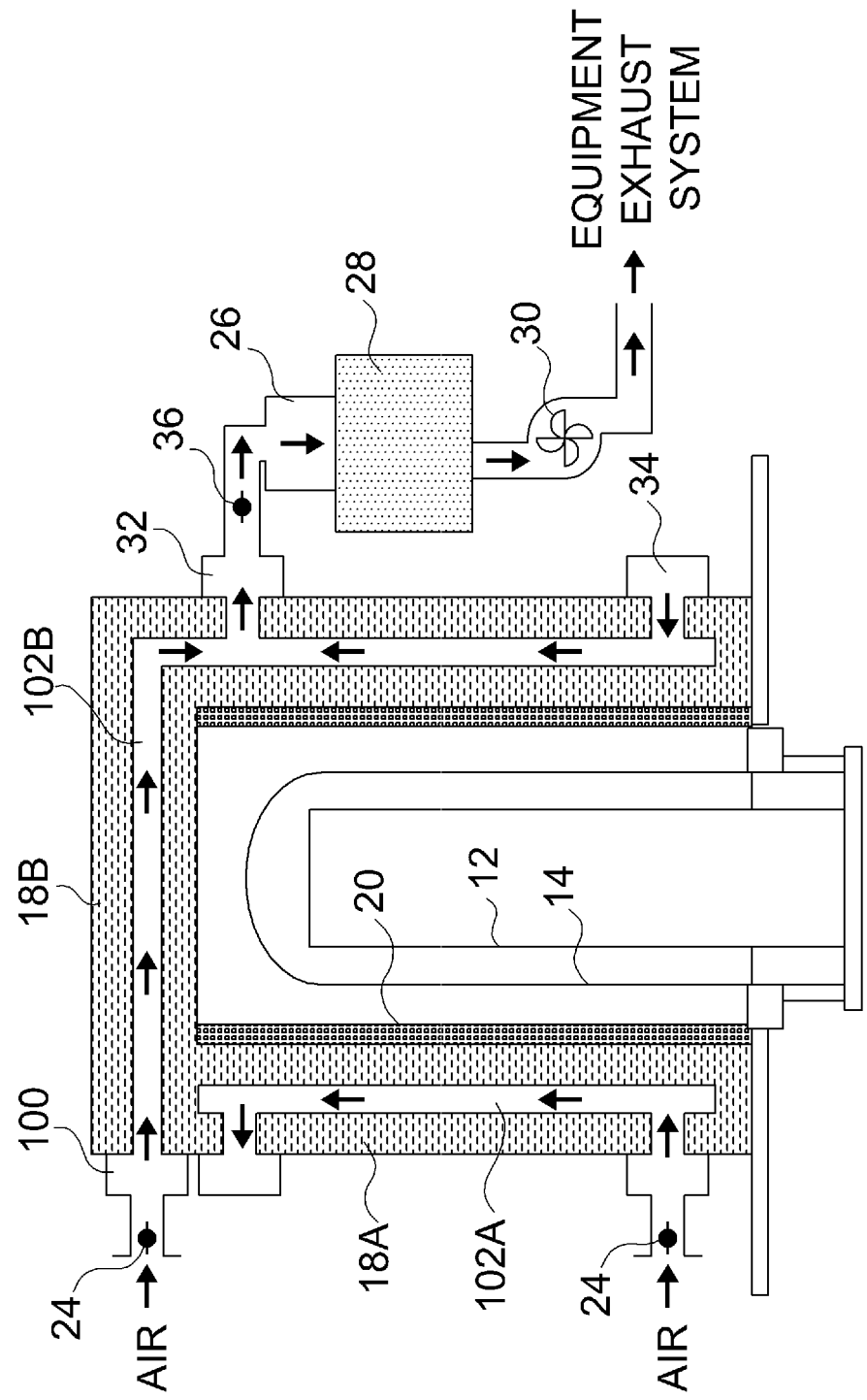

FIGS. 10A and 10B illustrate examples of an air circulation channel of a substrate processing apparatus according to the third embodiment. FIG. 10A illustrates a case that an air distribution channel 102A installed in the side surface insulating material 18A and the air distribution channel 102B installed in the ceiling surface insulating material 18B communicate with each other and air is discharged from an upper portion of an insulating wall 18 to an air circulation channel 26. The air distribution channel 102A installed in the side surface insulating material 18A and the air distribution channel 102B installed in the ceiling surface insulating material 18B will be referred together as an air circulation channel 102 in the present embodiment and hereinafter.

By configuring the air circulation channel 102 as illustrated in FIG. 10A, the air circulation channel 102 has a cylindrical shape, the top of which is open. Thus, an upper insulating wall of a reaction tube reception chamber may be evenly cooled and the number of components to be newly added is small, thereby improving temperature responsiveness while saving costs.

Similar to FIG. 10A, FIG. 10B illustrates a case that air distributing through the air distribution channel 102B installed in the ceiling surface insulating material 18B is inhaled using an intake port, which is different from an inlet port of air distributing through the air distribution channel 102A installed in the side surface insulating material 18A, and joins the air distributing through the air distribution channel 102A and is exhausted together with the air distributing through the air distribution channel 102A during a process of discharging air to the air circulation channel 26.

The insulating wall 18 including the air circulation channel 102 may have a simple structure by configuring the air circulation channel 102 as illustrated in FIG. 10B, and cooling performance may be improved by installing a plurality of intake ports to distribute the air through the air circulation channel 102.

By installing the air distribution channel 102B in the ceiling surface insulating material 18B as illustrated in FIGS. 10A and 10B, not only side surfaces of the insulating wall 18 but also a ceiling surface of a reaction tube reception chamber 16 may be cooled to increase the amount of radiated heat, thereby improving temperature responsiveness.

While exemplary embodiments of the present invention have been particularly described, the present invention is not limited thereto and may be embodied in different forms and various combinations without departing from the scope of the invention. Also, the effects of the present invention may be achieved from various modifications or combinations of the invention.

For example, in the previous embodiments, a heat insulation property may be increased by installing an insulating member formed of a heat-resistant material, such as quartz or silicon carbide, below a boat serving as a substrate retainer and formed of, for example, a heat-resistant material such as quartz or silicon carbide. Also, power consumption may be reduced by increasing a heat insulation property by forming an insulating wall insulating material outside an air circulation channel to a large thickness with respect to an insulating wall forming the air circulation channel. Also, an insulating wall insulating material between the air circulation channel and a heater may be formed to a small thickness so as to increase the amount of radiated heat and improve temperature responsiveness. Also, air is preferably used as a medium distributing through the air circulation channel to reduce operating expenses but the present invention is not limited to air and a gas such as an inert gas may be used. Also, the present invention is not limited to valves installed at an intake side and an exhaust side, and an opening/closing mechanism controlled by a control unit may be used.

Figure 11A:
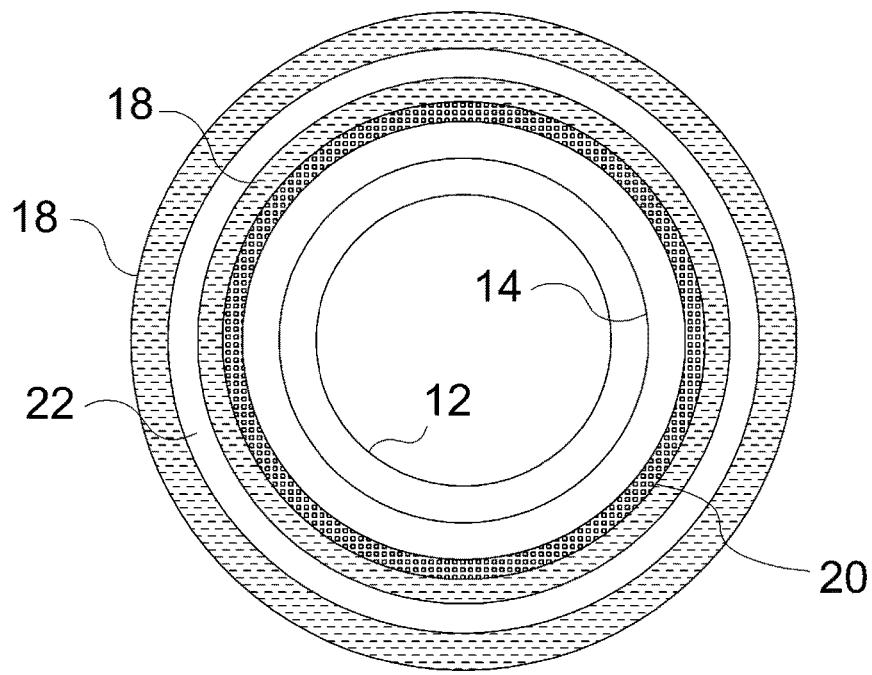
FIGS. 11A and 11B are horizontal cross-sectional views of parts of the substrate processing apparatuses according to the first to third embodiments.
Figure 11B:
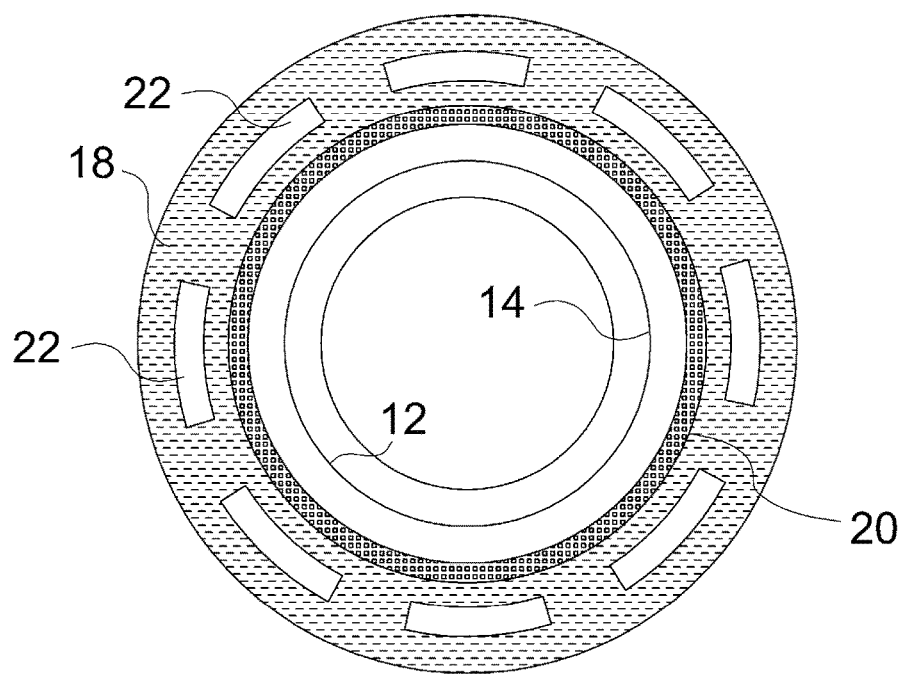

Also, in the embodiments 1 to 3 described above, the air distribution channel 22 or the air circulation channel 102 may have a cylindrical shape similar to a reaction tube reception chamber or may be manufactured in a discontinuous radial form. The structures of the air distribution channel 22 or the air circulation channel 102 will be described in detail with reference to FIGS. 11A and 11B below. In FIG. 11, reference numerals that are the same as those in FIGS. 1 to 3C, 10A and 10B denote the same elements as those in FIGS. 1 to 3C, 10A and 10B except for a special case.

FIGS. 11A and 11B are horizontal cross-sectional views of parts of the substrate processing apparatuses according to the first to third embodiments. FIG. 11A is a horizontal cross-sectional view when an air circulation channel having a cylindrical shape is installed in the substrate processing apparatuses according to the first to third embodiments. FIG. 11B is a horizontal cross-sectional view when an air circulation channel having a radial shape is installed in the substrate processing apparatuses according to the first to third embodiments. Referring to FIG. 11A, in a substrate processing apparatus, the air distribution channel 22 or the air circulation channel 102 is formed in a cylindrical shape in a vertical direction concentrically with an inner wall surface of a reaction tube reception chamber, thereby enabling air to be circulated or distributed. However, as illustrated in FIG. 11B, the air distribution channel 22 or the air circulation channel 102 may be formed in a radial shape rather than a continuous cylindrical shape, such that the air distribution channel 22 or the air circulation channel 102 is divided and arranged on the same circumference. Thus, air may be circulated or distributed in the air distribution channel 22 or the air circulation channel 102 at a uniform flow rate, thereby more uniformly cooling an entire insulating wall. Here, although eight distribution channels are illustrated as air circulation channels in FIG. 11B, the number of air circulation channels is not limited and may be appropriately changed according to process conditions. Also, referring to FIG. 11B, as an air intake method, chambers at an intake side may be connected to distribute air to air circulation channels or an air circulation channel may be installed in each of the air circulation channels to individually circulate or distribute air.

Figure 12A:
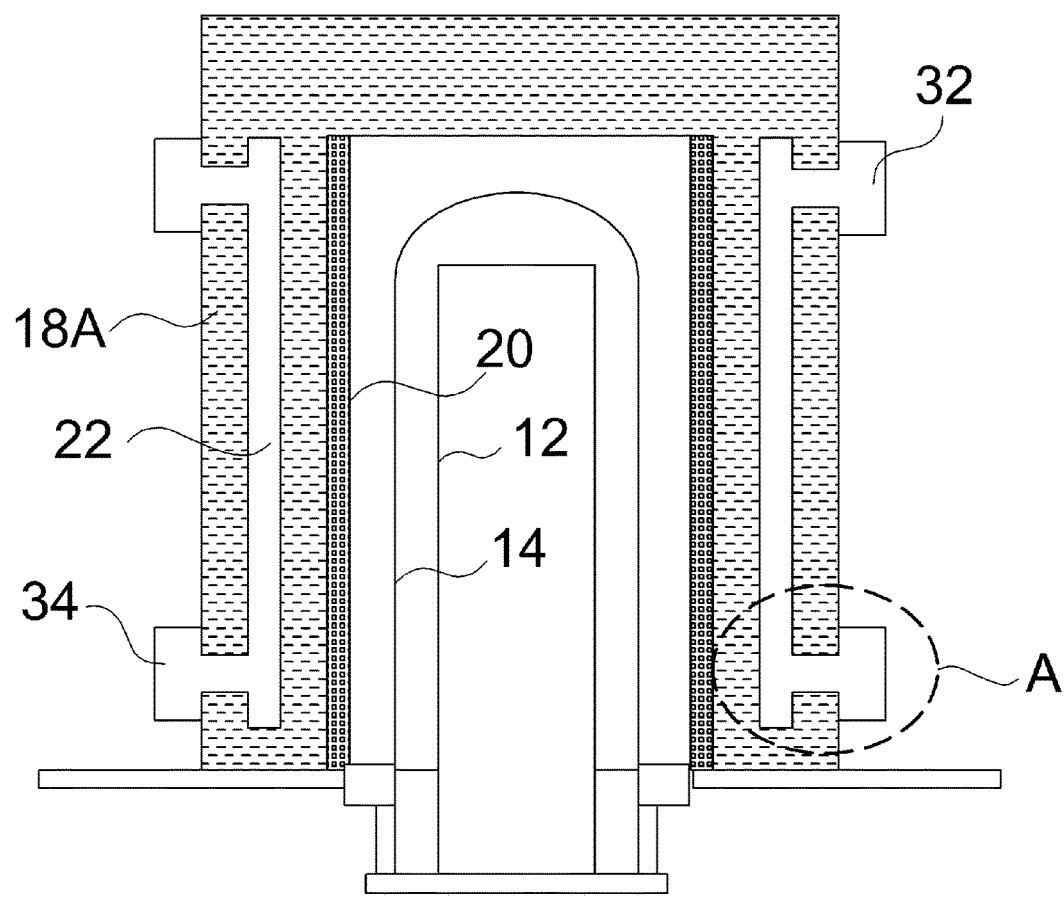
FIG. 12A is a schematic diagram of the substrate processing apparatuses according to the first to third embodiments.
Figure 12B:
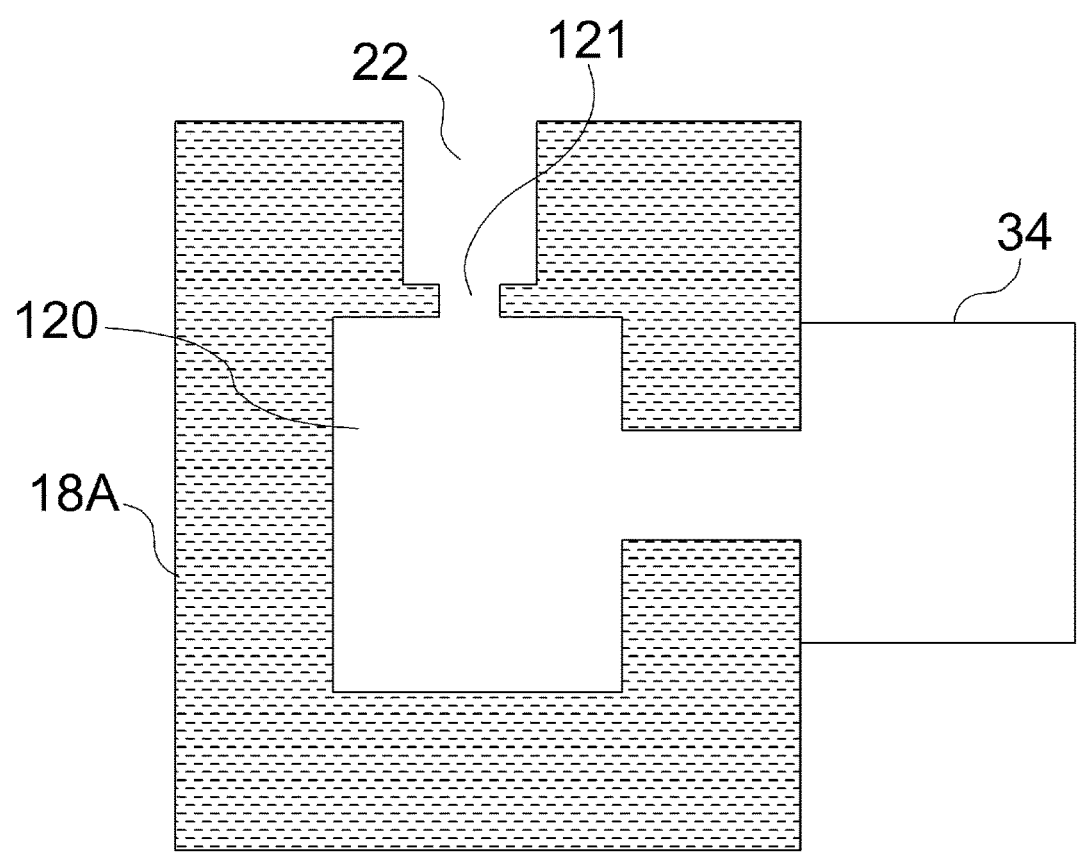
FIG. 12B is a partial enlarged view of FIG. 12A.

Also, in the first to third embodiments described above, a buffer region may be installed between a chamber at an intake side and an air circulation channel, as will be described in detail with reference to FIGS. 12A and 12B below. In FIGS. 12A and 12B, reference numerals that are the same as those in FIGS. 1 to 3C, 10A and 10B denote the same elements as those in FIGS. 1 to 3C, 10A and 10B except for a special case.

FIG. 12A is a schematic diagram of the substrate processing apparatuses according to the first to third embodiments. FIG. 12B is a partial enlarged view of FIG. 12A. FIG. 12A is a schematic diagram of the substrate processing apparatuses according to the first to third embodiments. FIG. 12B is an enlarged view of a region A of FIG. 12A. As illustrated in FIG. 12B, a buffer region 120 may be installed between a lower chamber 34 at an intake side and an air distribution channel 22 (or the air circulation channel 102), and a cross-sectional area of a flow channel of a connection unit 121 connecting the buffer region 120 and the air distribution channel 22 (or the air circulation channel 102) may be set to be smaller than the air distribution channel 22 or the air circulation channel 102, thereby uniformly controlling the amount of air to be distributed or circulated.

Here, although FIG. 12B illustrates the lower chamber 34 as a chamber at an intake side, the present invention is not limited thereto. When an intake port is present at an upper chamber 32, the above structure may be turned upside down such that the buffer region 120 installed between the upper chamber 32 and the air distribution channel 22 (or the air circulation channel 102) may be installed above the air distribution channel 22 using the upper chamber 32.

According to the present invention, a substrate processing apparatus and method capable of achieving higher temperature recovery characteristics and lower power consumption than the related art are provided.

<Exemplary Embodiments of the Present Invention>

Exemplary embodiments of the present invention are supplementarily described as follows.

(Supplementary Note 1)

According to one aspect of the present invention, there is provided a substrate processing apparatus including:
a reaction container where a substrate retainer having a substrate placed thereon is loaded;
an insulating wall including therein a reaction container accommodation chamber wherein the insulating wall is made of an insulating material and configured to accommodate the reaction container;
a heater installed in the reaction container accommodation chamber;
an air circulation channel installed in a sidewall of the insulating wall;
an air circulation mechanism configured to distribute air to the air circulation channel;
a first valve installed at an inlet of the air circulation channel;
a second valve installed at an outlet of the air circulation channel; and
a control unit configured to control the heater, the air circulation mechanism, the first valve and the second valve to: circulate the air in the air circulation channel by the air circulation mechanism with the first valve and the second valve closed or to distribute the air in the air circulation channel by the air circulation mechanism with the first valve and the second valve open in a temperature elevating process of heating the substrate to a target temperature by the heater when a temperature of the substrate exceeds the target temperature; stop an operation of the air circulation mechanism with the first valve and the second valve closed when the temperature of the substrate is lowered to the target temperature; and distribute the air in the air circulation channel by the air circulation mechanism with the first valve and the second valve open in a temperature lowering process of lowering the temperature of the substrate to be less than the target temperature.

(Supplementary Note 2)

In the substrate processing apparatus of Supplementary note 1, the air circulation channel is installed in the sidewall in a cylindrical shape vertically and concentrically with the reaction container.

(Supplementary Note 3)

In the substrate processing apparatus of Supplementary note 1, the air circulation channel is radially installed in the sidewall along a circumferential direction of the reaction container.

(Supplementary Note 4)

The substrate processing apparatus of Supplementary note 1, further including: chambers communicating with the air circulation channel and the inlet and the outlet thereof; and an air circulation channel configured to circulate the air in the air circulation channel.

(Supplementary Note 5)

In the substrate processing apparatus of Supplementary note 1, an air cooling unit configured to cool the air circulating through the air circulation channel is further included, and the control unit is configured to control the air cooling unit to distribute the air via the air cooling unit in the temperature lowering process wherein the temperature of the substrate is lowered to be less than the target temperature.

(Supplementary Note 6)

The substrate processing apparatus of Supplementary note 1, further including:
a liner tube installed between the insulating wall and the reaction container;
a rapid cooling channel installed in a space between the insulating wall and the liner tube; and
a rapid cooling exhaust channel comprising an opening disposed at a portion of the reaction container accommodation chamber and communicating with the rapid cooling channel.

(Supplementary Note 7)

According to another aspect of the present invention, there is provided a method of method of manufacturing a semiconductor device using a substrate processing apparatus including a reaction container where a substrate retainer having a substrate placed thereon is loaded, an insulating wall including therein a reaction container accommodation chamber wherein the insulating wall is made of an insulating material and configured to accommodate the reaction container, a heater installed in the reaction container accommodation chamber, an air circulation channel installed in a sidewall of the insulating wall, an air circulation mechanism configured to distribute air to the air circulation channel, a first valve installed at an inlet of the air circulation channel, and a second valve installed at an outlet of the air circulation channel, the method including:

(a) elevating a temperature of the substrate from room temperature to a target temperature;

(b) processing the substrate by introducing a predetermined source gas into the reaction container at the target temperature; and (c) lowering the temperature of the substrate to be less than the target temperature after the substrate reacts with the source gas, wherein in the step (a), the air is circulated in the air circulation channel using the air circulation mechanism with the first valve and the second valve closed or distributed in the air circulation channel using the air circulation mechanism with the first valve and the second valve open when the temperature of the substrate exceeds the target temperature, and an operation of the air circulation mechanism is stopped with the first valve and the second valve closed when the temperature of the substrate is lowered to the target temperature, and in the step (c), the air is distributed to the air circulation channel using the air circulation mechanism with the first valve and the second valve open.

wherein the step (a) comprises: circulating the air in the air circulation channel by the air circulation mechanism with the first valve and the second valve closed or distributing the air in the air circulation channel by the air circulation mechanism with the first valve and the second valve open when a temperature of the substrate exceeds the target temperature; and stopping an operation of the air circulation mechanism with the first valve and the second valve closed when the temperature of the substrate is lowered to the target temperature; and wherein the step (c) comprises distributing the air in the air circulation channel by the air circulation mechanism with the first valve and the second valve open.

(Supplementary Note 8)

According to still another aspect of the present invention, there is provided a method of processing a substrate using a substrate processing apparatus including a reaction container where a substrate retainer having a substrate placed thereon is loaded, an insulating wall including therein a reaction container accommodation chamber wherein the insulating wall is made of an insulating material and configured to accommodate the reaction container, a heater installed in the reaction container accommodation chamber, an air circulation channel installed in a sidewall of the insulating wall, an air circulation mechanism configured to distribute air to the air circulation channel, a first valve installed at an inlet of the air circulation channel, and a second valve installed at an outlet of the air circulation channel, the method including:

(a) elevating a temperature of the substrate from room temperature to a target temperature;

(b) processing the substrate by introducing a predetermined source gas into the reaction container at the target temperature; and (c) lowering the temperature of the substrate to be less than the target temperature after the substrate reacts with the source gas, wherein in the step (a), the air is circulated in the air circulation channel using the air circulation mechanism with the first valve and the second valve closed or distributed in the air circulation channel using the air circulation mechanism with the first valve and the second valve open when the temperature of the substrate exceeds the target temperature, and an operation of the air circulation mechanism is stopped with the first valve and the second valve closed when the temperature of the substrate is lowered to the target temperature, and in the step (c), the air is distributed to the air circulation channel using the air circulation mechanism with the first valve and the second valve open.

wherein the step (a) comprises: circulating the air in the air circulation channel by the air circulation mechanism with the first valve and the second valve closed or distributing the air in the air circulation channel by the air circulation mechanism with the first valve and the second valve open when a temperature of the substrate exceeds the target temperature; and stopping an operation of the air circulation mechanism with the first valve and the second valve closed when the temperature of the substrate is lowered to the target temperature; and wherein the step (c) comprises distributing the air in the air circulation channel by the air circulation mechanism with the first valve and the second valve open.

(Supplementary Note 9)

According to yet another aspect of the present invention, there is provided a method of manufacturing a semiconductor device, the method including:

(a) loading a substrate retainer having a substrate placed thereon into a reaction container;

(b) elevating an inner temperature of the reaction container to a predetermined temperature using an insulating wall made of an insulating material wherein the insulating wall includes a reaction container accommodation chamber for accommodating the reaction container therein, an air circulation channel installed in a sidewall thereof and configured to distribute or circulate air therein, an air circulation mechanism configured to distribute or circulate the air in the air circulation channel, a first valve installed at an inlet of the air circulation channel and a second valve installed at an outlet of the air circulation channel, and a heater installed between the insulating wall and the reaction container, (c) lowering the inner temperature of the reaction container to the predetermined temperature by controlling at least the heater, the first valve and the second valve to circulate the air in the air circulation channel with the first valve and the second valve closed or to distribute the air in the air circulation channel with the first valve and the second valve open when the inner temperature of the reaction container exceeds the predetermined temperature in the step (a); and (d) processing the substrate by controlling the first valve, the second valve and the air circulation mechanism to stop an operation of the air circulation mechanism with the first valve and the second valve closed causing the air to stay in the air circulation channel and maintaining the inner temperature of the reaction container constant after performing the step (c); and (e) lowering the inner temperature of the reaction container to be less than the predetermined temperature by distributing the air to the air circulation channel using the air circulation mechanism with the first valve and the second valve open after performing the step (d).

(Supplementary Note 10)

According to yet another aspect of the present invention, there is provided a method of processing a substrate including:

(a) loading a substrate retainer having a substrate placed thereon into a reaction container;

(b) elevating an inner temperature of the reaction container to a predetermined temperature using an insulating wall made of an insulating material wherein the insulating wall includes a reaction container accommodation chamber for accommodating the reaction container therein, an air circulation channel installed in a sidewall thereof and configured to distribute or circulate air therein, an air circulation mechanism configured to distribute or circulate the air in the air circulation channel, a first valve installed at an inlet of the air circulation channel and a second valve installed at an outlet of the air circulation channel, and a heater installed between the insulating wall and the reaction container, (c) lowering the inner temperature of the reaction container to the predetermined temperature by controlling at least the heater, the first valve and the second valve to circulate the air in the air circulation channel with the first valve and the second valve closed or to distribute the air in the air circulation channel with the first valve and the second valve open when the inner temperature of the reaction container exceeds the predetermined temperature in the step (a); and (d) processing the substrate by controlling the first valve, the second valve and the air circulation mechanism to stop an operation of the air circulation mechanism with the first valve and the second valve closed causing the air to stay in the air circulation channel and maintaining the inner temperature of the reaction container constant after performing the step (c); and (e) lowering the inner temperature of the reaction container to be less than the predetermined temperature by distributing the air to the air circulation channel using the air circulation mechanism with the first valve and the second valve open after performing the step (d).

The present invention is applicable to a substrate processing apparatus, a method of processing a substrate and a method of manufacturing a semiconductor device which are capable of achieving higher temperature recovery characteristics and lower power consumption than the related art.

What is claimed is:

1. A substrate processing apparatus comprising:
   a reaction container where a substrate retainer having a substrate placed thereon is loaded;
   an insulating wall including therein a reaction container accommodation chamber wherein the insulating wall is made of an insulating material and configured to accommodate the reaction container;
   a heater installed in the reaction container accommodation chamber;
   a gas distribution channel installed in a sidewall of the insulating wall;
   a gas distribution mechanism configured to distribute air or an inert gas to gas distribution channel;
   an intake valve installed at an inlet of the gas distribution channel;
   an exhaust valve installed at an outlet of the gas distribution channel; and
   a control unit configured to: control the heater to heat the substrate to a target temperature; control the gas distribution mechanism to circulate the air or the inert gas in the gas distribution channel while controlling the intake valve and the exhaust valve to be in closed state when a temperature of the substrate exceeds the target temperature in a temperature elevating process or control the gas distribution mechanism to distribute the air or the inert gas in the gas distribution channel while controlling the intake valve and the exhaust valve to be in open state when the temperature of the substrate exceeds the target temperature in the temperature elevating process; and control the gas distribution mechanism to stop an operation thereof while controlling the intake valve and the exhaust valve to be in closed state when the temperature of the substrate is lowered to the target temperature,
   wherein the control unit is further configured to control the gas distribution mechanism to distribute the air or the inert gas in the gas distribution channel while controlling the intake valve and the exhaust valve to be in open state in a temperature lowering process of lowering the temperature of the substrate to be less than the target temperature.

2. The substrate processing apparatus of claim 1, wherein the gas distribution channel is installed in the sidewall in a cylindrical shape vertically and concentrically with the reaction container.

3. The substrate processing apparatus of claim 1, wherein the gas distribution channel is radially installed in the sidewall along a circumferential direction of the reaction container.

4. The substrate processing apparatus of claim 1, further comprising:
   chambers communicating with the gas distribution channel and the inlet and the outlet thereof; and
   a gas circulation channel configured to circulate the air or the inert gas in the gas distribution channel.

5. The substrate processing apparatus of claim 1, further comprising a gas cooling unit configured to cool the air or the inert gas circulating through the gas distribution channel,
   wherein the control unit is configured to control the gas distribution mechanism to distribute the air or the inert gas via the gas cooling unit in the temperature lowering process.

6. The substrate processing apparatus of claim 1, further comprising:
   a liner tube installed between the insulating wall and the reaction container;
   a rapid cooling channel installed in a space between the insulating wall and the liner tube; and
   a rapid cooling exhaust channel comprising an opening disposed at a portion of the reaction container accommodation chamber and communicating with the rapid cooling channel.

* * * * *